US011859279B2

(12) United States Patent
Gicquel et al.

(10) Patent No.: US 11,859,279 B2
(45) Date of Patent: Jan. 2, 2024

(54) MODULAR REACTOR FOR MICROWAVE PLASMA-ASSISTED DEPOSITION

(71) Applicant: DIAM CONCEPT, Paris (FR)

(72) Inventors: Alix Gicquel, Trouville-sur-Mer (FR); François Des Portes, Paris (FR)

(73) Assignee: DIAM CONCEPT, Paris (FR)

( * ) Notice: Subject to any disclaimer, the term of this patent is extended or adjusted under 35 U.S.C. 154(b) by 142 days.

(21) Appl. No.: 16/467,828

(22) PCT Filed: Dec. 8, 2017

(86) PCT No.: PCT/FR2017/053482
§ 371 (c)(1),
(2) Date: Jun. 7, 2019

(87) PCT Pub. No.: WO2018/104689
PCT Pub. Date: Jun. 14, 2018

(65) Prior Publication Data
US 2021/0087676 A1    Mar. 25, 2021

(30) Foreign Application Priority Data

Dec. 9, 2016   (FR) ...................................... 1670746

(51) Int. Cl.
*C23C 16/511*         (2006.01)
*C23C 16/27*          (2006.01)
(Continued)

(52) U.S. Cl.
CPC ........ *C23C 16/274* (2013.01); *C23C 16/4586* (2013.01); *C23C 16/45563* (2013.01);
(Continued)

(58) Field of Classification Search
CPC ........... H01J 37/32807; H01J 37/32513; H01J 37/32458; H01J 37/32192; C23C 16/274
See application file for complete search history.

(56) References Cited

U.S. PATENT DOCUMENTS

| 8,859,058 B2 | 10/2014 | Dodge et al. |
| 2004/0149389 A1* | 8/2004 | Fink .................. H01J 37/32642 156/345.51 |

(Continued)

FOREIGN PATENT DOCUMENTS

| CN | 103339707 A | 10/2013 |
| CN | 103415647 A | 11/2013 |

(Continued)

OTHER PUBLICATIONS

International Search Report and Written Opinion or PCT/FR2017/053482 (with translation), dated Mar. 9, 2018, 15 pages.

(Continued)

*Primary Examiner* — Aiden Lee
(74) *Attorney, Agent, or Firm* — Pearne & Gordon LLP

(57) ABSTRACT

The invention relates to a microwave plasma-assisted deposition modular reactor for manufacturing synthetic diamond. The reactor has at least three modulation elements selected from: a crown adapted to be positioned between a first enclosure part and a second enclosure part; a substrate holder module mobile in vertical translation and in rotation, in contact with a quarter-wave and including at least one fluid cooling system; a tray mobile in vertical translation in order to change the shape and volume of the resonant cavity and including through openings allowing the gases to pass; a gas distribution module, including a removable gas distribution plate comprising an inner surface, an outer surface, and a plurality of gas distribution nozzles forming channels between said surfaces capable of conducting a gas flow, and a support device connected to a cooling system and adapted to accommodate the removable gas distribution plate; and a substrate cooling control module including a removable thermal resistance gas injection device.

15 Claims, 12 Drawing Sheets

(51) Int. Cl.
| | |
|---|---|
| C23C 16/455 | (2006.01) |
| C23C 16/458 | (2006.01) |
| C23C 16/46 | (2006.01) |
| C30B 25/08 | (2006.01) |
| C30B 25/12 | (2006.01) |
| C30B 25/14 | (2006.01) |
| C30B 25/20 | (2006.01) |
| C30B 29/04 | (2006.01) |
| H01J 37/32 | (2006.01) |

(52) U.S. Cl.
CPC .......... *C23C 16/466* (2013.01); *C23C 16/511* (2013.01); *C30B 25/08* (2013.01); *C30B 25/12* (2013.01); *C30B 25/14* (2013.01); *C30B 25/20* (2013.01); *C30B 29/04* (2013.01); *H01J 37/3244* (2013.01); *H01J 37/32201* (2013.01); *H01J 37/32247* (2013.01); *H01J 37/32458* (2013.01); *H01J 37/32513* (2013.01); *H01J 37/32715* (2013.01); *H01J 37/32724* (2013.01); *H01J 37/32834* (2013.01); *H01J 2237/20214* (2013.01); *H01J 2237/20235* (2013.01); *H01J 2237/332* (2013.01)

(56) References Cited

U.S. PATENT DOCUMENTS

| | | | | |
|---|---|---|---|---|
| 2005/0205015 | A1* | 9/2005 | Sasaki | C23C 16/45574 |
| | | | | 118/723 MA |
| 2009/0239078 | A1 | 9/2009 | Asmussen et al. | |
| 2010/0012275 | A1* | 1/2010 | Yamashita | H01J 37/32192 |
| | | | | 156/345.41 |
| 2014/0051253 | A1* | 2/2014 | Guha | H01J 37/321 |
| | | | | 438/710 |
| 2014/0150713 | A1* | 6/2014 | Coe | C30B 25/02 |
| | | | | 117/88 |
| 2014/0220261 | A1 | 8/2014 | Asmussen et al. | |
| 2014/0349068 | A1* | 11/2014 | Inglis | C23C 16/4586 |
| | | | | 428/141 |
| 2015/0191824 | A1* | 7/2015 | Grill | C23C 16/274 |
| | | | | 427/585 |
| 2017/0069553 | A1* | 3/2017 | Oh | H01L 21/3065 |

FOREIGN PATENT DOCUMENTS

| | | |
|---|---|---|
| GB | 2486783 | 6/2012 |
| GB | 2497661 | 6/2013 |
| WO | 03029513 A1 | 4/2003 |
| WO | 2015071484 | 5/2015 |

OTHER PUBLICATIONS

Su J J et al., "A dome-shaped cavity type microwave plasma chemical vapor deposition reactor for diamond films deposition." Vacuum, vol. 17, pp. 51-55, Apr. 2014.

An K Et al., "Microwave plasma reactor with conical-reflector for diamond deposition." Vacuum, vol. 117, pp. 112-120, Apr. 2015.

Kobashi et al. "R&D of diamond films in the Frontier Carbon Technology Project and related topics." Diamond and Related Materials 12, pp. 233-240. 2003.

Ando et al. "Large area deposition of <100>-textured diamond films by a 60-kW microwave plasma CVD reactor." Diamond and Related Materials 11, pp. 596-600. 2002.

Gicquel, et al. "CVD Diamond Films; from growth to applications." Current Applied Physics 1, pp. 479-496. 2001.

Goodwin, D.G. "Scaling Laws for Diamond Chemical Vapor Deposition. I: Diamond Surface Chemistry." Journal of Applied Physics, Dec. 1, 1993. 20 pages.

Mankelevich, et al. "Plasma-chemical processes in microwave plasma-enhanced chemical vapor deposition reactors operating with C/H/Ar gas mixtures." Journal of Applied Physics 104. 2008. 11 pages.

Hassouni et al. "Modelling of diamond deposition microwave cavity generated plasmas." Journal of Physics D: Applied Physics. vol. 43. Mar. 30, 2010. 45 pages.

Hassouni et al. "Self-Consistent Microwave Field and Plasma Discharge Simulations for a Moderate Pressure Hydrogen Discharge Reactor." Journal of Applied Physics 86, pp. 134. 1999.

\* cited by examiner

MODULAR REACTOR FOR MICROWAVE PLASMA-ASSISTED DEPOSITION

The invention relates to the field of diamond synthesis by microwave plasma-assisted deposition. The invention relates to a modular reactor for microwave plasma-assisted deposition including at least three modulation elements allowing for adaptation in order to optimize the reactor configurations to the different objectives of the growths achieved and the maintenance needs of such reactors. The invention also relates to a diamond synthesis method by such a reactor and the modulation elements composing such a reactor.

Previous Art

Thanks to its mechanical, optical, thermal, electronic, and chemical properties, synthetic diamond is increasingly used in industry.

Thus, it is found as an essential component of many products such as optical windows, cutting tools, radiation detectors, electrodes, but also in electronics, such as a thermal drain, and is very promising for applications in power electronics.

Today, there is a trend towards increasing the size of microwave plasma-assisted deposition reactors in order to increase the size of the polycrystalline layers produced or the number of diamond single crystals that can be produced in one experiment, and this particularly in order to achieve economies of scale.

The person skilled in the art knows the influence and interdependence of many variables to adjust the growth conditions to the objectives pursued. During the deposition and growth phases of diamond layers, it is known to the person skilled in the art that variables and parameters such as the pressure, the power, the temperature of the one or more substrates, the concentration and composition of the injected gases, their distribution within the reactor, the electromagnetic propagation, the position, and the size of the one or more substrates, their distance from the plasma, generate effects on the growth of diamond layers.

Similarly, it is known to the person skilled in the art that the physical characteristics of the reactor, its design, the shape of its one or more cavities, and the materials that constitute it, the location, the design, and the sizing of microwave and gas injection systems or cooling systems influence, as such, the characteristics of the diamond layers, but also the parameters mentioned above (Kobashi et al. Diamond and Related Materials 12, 2003, 233-240; Ando Y et al. Diamond and Related Materials. 11, 2002, 596-600; Mesbahi et al. Journal of Applied Physics 2013, vol 46, no. 38, 2013). Thus, many articles mention the complexity of diamond deposition methods within plasma reactors due to the multiplicity of parameters to be considered and the need to resort to simulation models that simplify the data and reduce the variables (Gicquel et al. Diamond and Related Materials, 1994, vol 3, Issue 4-6, 581; Gicquel et al. Current Applied Physics, vol 1 Issue 6, 479, 2001; Hassouni et al. Journal of Applied Physics, vol 86 Issue 1, pages: 134-1999; Hassouni et al. Journal of Physics D Journal of Applied Physics, vol 43 Issue: 15, 2010; Goodwin et al, J, Appl. Phys. 74 (11) 1993; Kobashi et al. 2003 Diamond and Related Materials, 12, 233-240; Mankelevich et al., Journal Of Applied Physics, 104, 2008).

The factors contributing to the deposition and the growth of diamond layers, due to their number and their complexity, are therefore still only partially controlled by the person skilled in the art, who has to resort to simplifying models, although they can evolve, to both conceptualize and build reactors and conduct operations.

Resorting to modeling is also justified by the fact that reactors are quite expensive in terms of capital, but it has the major disadvantage of limiting the experimental development: the constants or variables initially chosen define and/or circumscribe the result either in terms of final design and/or sets of parameters.

While being aware of the need to vary some parameters, the person skilled in the art tends to limit them by favoring constants and/or fixed elements. The implementation of devices allowing a large number of elements to be modulated, whether they are related to the physical characteristics of the reactors or to the parameters, appears today to be limited and contrary to the trend of the developments made.

In terms of modulation of physical elements, the person skilled in the art has developed mobile and/or interchangeable substrate holders, as it is established that the distance between the growth surface and the plasma influences the characteristics of a diamond deposition. Thus, the patent application US2014220261 reports a "bell jar" reactor comprising only two mobile and sliding elements, including the substrate holder, in order to be able to modulate during operations the microwave modes, the discharge intensities, the power densities, and thus the shape and size of the plasma. Similarly, the patent application US2009239078 provides a device in a "bell jar" reactor for interchanging the substrate holders to adapt the deposition conditions. Similarly, Gicquel et al use a mobile substrate holder to change the position of the substrate in the reactor (A. Gicquel, M. Chennevier, M. Lefebvre, Chap 19, pp 739-756, Handbook of industrial diamond and diamond films, Marcel Dekker, 1998).

At the beginning of the growth phases and/or during growth, the experimental variables such as pressure, power, gas flow rates, concentrations, or compositions, or the like, are frequently adjusted in relation to each other (reduction or increase in flow rates, etc.).

Nevertheless, modularity conceived as a structuring device in the design of a reactor and as an arrangement to favor the interaction and combinatorics of the physical devices and experimental variables seems to be rejected by the person skilled in the art, favoring the search for an "optimized" reactor, simplified for a particular use, with parts and elements that can be adjusted and modulated reduced as much as possible.

Thus, in the above-mentioned patent application US2014220261 reporting mobile parts, the inventors chose to provide "kits" of parts with different diameters or characteristics allowing to compose different reactors from different basic elements and not to modulate the basic elements during growth.

Similarly, in U.S. Pat. No. 8,359,058 in the description of the invention, the inventors report their willingness to "simplify the reactor" by reducing the number of removable or mobile components.

Thus, there is a need for new reactors capable of addressing the problems caused by the commercial reactors currently available.

Technical Problem

The invention aims to overcome the disadvantages of the prior art. In particular, the invention aims to provide a microwave-assisted plasma deposition modular reactor which, unlike the reactors of the prior art, is highly modular.

Counter-intuitively and out of step with the trends applied by the person skilled in the art as well as with their own previously conducted works, the inventors have found, on the contrary, that a reactor highly modular, but designed as a homogeneous assembly, simplified both the manufacture of diamond layers for a plurality of applications and made A easier to develop and gradually control diamond growth phases. These characteristics indeed allow to alternately or cumulatively shorten the steps, the risks of errors, the maintenance, the duration, and the costs in the event of an adjustment or a modification of the configurations, while increasing the possibilities of varying the variables and thus the evolutivity of both reactors and methods by not reducing the design and deposition methods to the assumptions and preliminary analyses conducted during the modeling phases. Finally, they noted that the combinatorics and concomitant modulation, during growth, of several physical devices and experimental variables (such as the concomitant modulation of the distribution of the gas flow rates and their compositions, the pressure/power conditions, combined with a movement of the substrate holder, the modification of the size and shape of the resonant cavity, and the efficiency of the thermal bridge for cooling the substrate) were effective in achieving the objectives pursued.

This modularity is all the more relevant to meet the development of the diamond synthesis industry, in particular that of high thickness diamond single crystals and in the configuration of an increase in reactor size and therefore appears particularly adapted to the reactors operating at frequencies of less than 1000 MHz.

The modular reactor has the advantage of being able to adjust the cavity without having to resort to a complete new design of the cavity or even the reactor. The invention further allows to improve the cavity and plasma calculation means implemented.

The modularity of this reactor makes it possible, from a same reactor, to easily change the shape of the cavity, the volume of the cavity, the gas distribution, the position of the substrate, its electrical potential in relation to that of the cavity, and the cooling of the substrate in order to adapt the reactor to the growth conditions of the desired diamond layers (shape, microstructure, number, size). This modularity therefore allows to optimize the synthesis reactions to the different growth conditions, and it can be particularly useful in the search for optimum growth conditions for particular applications. Indeed, not all growths require the same conditions and configurations depending, for example, on the surface and thickness dimensions of the diamond layer to be synthesized, their shape, the expected purity, the desired crystalline characteristics, the doping, or the desired growth rate. This modularity of the physical properties has the double advantage of allowing the creation of a single piece of equipment to meet the needs of several configurations, but also within a same initial configuration, to vary it during operating phases in order to optimize the expected result.

In addition, this modular reactor has the advantage of allowing the substrate holder, and therefore the substrate, to move vertically in the plasma and at the plasma boundary, or even out of the plasma during the deposition method. This leads to a very high control of local growth conditions at the surface of the growing diamond. Moreover, in economic terms, in a developing industry, this modular reactor also allows to vary the different growth conditions at a lower cost without having to invest in new prototypes and thus to gain both in speed and in reduction of experimental costs. This new modular reactor also allows to ensure an efficient coding of its various components, to ensure a sectorized gas supply and to allow a continuous observation of the growth development.

The invention also aims to provide a growth method that takes advantage of the modular properties of this new modular reactor.

The invention also provides the modular elements that can constitute the modular reactor.

BRIEF DESCRIPTION OF THE INVENTION

To that end, the invention relates to a microwave plasma-assisted modular deposition reactor for manufacturing synthetic diamond, said reactor comprising:
  a microwave generator configured to generate microwaves, the frequency of which is between 300 MHz and 3000 MHz, preferably between 900 MHz and 1000 MHz, or between 300 MHz and 500 MHz,
  a resonant cavity formed, at least in part, by the cylindrical inner walls of a reactor enclosure,
  a gas inlet system capable of supplying gases within the resonant cavity,
  a gas output module capable of removing said gases from the resonant cavity,
  a wave coupling module capable of transferring the microwaves from the microwave generator into the resonant cavity, preferably initially in a TM011 mode, in order to allow the formation of a plasma, and
  a growth support present in the resonant cavity,
said modular reactor being characterized in that it comprises at least two modulation elements, preferably at least three modulation elements, said modulation elements being selected from:
  a crown adapted to be positioned between a first enclosure part and a second enclosure part in order to change the shape and volume of the resonant cavity, and a seal system, allowing for the vacuum tightness and electrical continuity of the walls of the enclosure, being arranged between the crown and the first enclosure part and the second part of the enclosure, respectively;
  a substrate holder module, mobile in vertical translation and in rotation, in contact with a quarter-wave and including at least one fluid cooling system;
  a tray mobile in vertical translation in order to change the shape and volume of the resonant cavity and including through openings allowing the gases to pass;
  a gas distribution module, including:
    a removable gas distribution plate comprising an inner surface, an outer surface, and a plurality of gas distribution nozzles forming channels between said surfaces capable of conducting a gas flow, and
    a support device connected to a coding system and adapted to accommodate the removable gas distribution plate: and
  a substrate cooling control module, including a removable thermal resistance gas injection device, said removable thermal resistance gas injection device comprising one or more thermal resistance gas inputs and one or more thermal resistance gas outputs.

This modular reactor can be optimized for a wide range of growth conditions indeed, a single reactor can then have optimized specifications for several applications or even improve, for a same application, the conditions during growth and this without having its structure modified. These modulation elements, combined, allow to change the characteristics of the plasma and therefore the growth conditions in order to adapt the plasma to the desired growth.

According to other optional characteristics of the reactor:

The microwave plasma-assisted modular deposition reactor for manufacturing synthetic diamond according to the invention comprises at least four modulation elements selected from the modulation elements listed above. This further increases the modularity of the reactor according to the invention.

The microwave plasma-assisted modular deposition reactor for manufacturing synthetic diamond according to the invention comprises a tray mobile in vertical translation in order to change the shape and volume of the resonant cavity and including through openings allowing the gases to pass. This has the advantage, for the user, of being able to quickly change the dimensions of the resonant cavity. However, changing the dimensions and the shape of the resonant cavity will lead to a change in the shape of the plasma and thus change the local growth conditions of the diamond film. The tray according to the invention has the advantage of being able to be moved before growth, but also during growth. This makes it possible for the user to change the shape, the characteristics, and the position of the plasma so that they are adapted to the position of the growing surface of the substrate and the synthesis step.

The tray includes at least one cooling channel connected to a coding system and capable of cooling said tray. This also allows to limit or avoid its deformation because it can be subjected to very high temperatures during operation.

The microwave plasma-assisted modular deposition reactor for manufacturing synthetic diamond according to the invention comprises a substrate holder module, mobile in vertical translation and in rotation, in contact with a quarter-wave and possibly an electrical insulator and including at least one fluid cooling system. This substrate holder allows to limit the propagation of the microwaves outside the resonant cavity, while improving the growth homogeneity over the entire growth surface, and giving the possibility of varying, during an experiment, the arrangement of the substrate with respect to the plasma. It also allows to have the growth support electrically insulated from the rest of the enclosure. This is possible by electrically insulating the substrate holder module, the enclosure, and/or the mobile tray. Thus, preferably, the substrate holder module is electrically insulated from the enclosure and/or the tray.

The substrate holder has a volume ratio between 5% and 30% with respect to the volume of the resonant cavity, and preferably between 7% and 13%.

The microwave plasma-assisted modular deposition reactor for manufacturing synthetic diamond according to the invention comprises at least one crown adapted to be positioned between a first enclosure part and a second enclosure part in order to change the shape and volume of the resonant cavity, and a seal system, allowing for the vacuum tightness and electrical continuity of the walls of the enclosure, being arranged between the crown and the first enclosure part and the second part of the enclosure, respectively. This crown allows the geometry of the resonant cavity to be varied, for example by increasing the distance between the dielectric wave injection window and the substrate support. This modular element thus allows to optimize the radial distributions of gas temperature and atomic H density in the plasma and consequently at the plasma/surface interface. Advantageously, the modular reactor includes two crowns. The crowns can be between 1 cm and 20 cm high, the one or more crowns include a dielectric material, a gas injection system or consist in a metal with an inner diameter smaller than the inner diameter of the resonant cavity.

The microwave plasma-assisted modular deposition reactor for manufacturing synthetic diamond according to the invention comprises gas distribution module, comprising:
 a removable gas distribution plate comprising an inner surface, an outer surface, and a plurality of gas distribution nozzles forming channels between said surfaces capable of conducting a gas flow, and
 a support device connected to a cooling system and adapted to accommodate the removable gas distribution plate.

This gas distribution module has the advantage of providing good gas flow characteristics. This module, in this context, is particularly useful in the context of modulating the growth conditions because, since it is removable, it can be adapted depending on the position of the one or more substrates, the number of substrates and the anticipated duration of the reaction. In addition, conventional gas distribution nozzles have the disadvantage of getting dogged up. The existence of such a distribution module makes it possible to replace the removable gas distribution plate quickly and at a lower cost, without having to replace a whole set of parts connected to such a module.

The support device comprises channels capable of circulating a fluid in said support device for allowing a thermal bridge to be established making it possible to cod the removable gas distribution plate.

The removable gas distribution plate includes at least one end part that does not comprise distribution nozzles and is adapted to be in contact with the support device on a surface greater than or equal to 10% of the lower surface of the removable gas distribution plate in order to improve heat transfer. This allows to improve the control of the temperature of the distribution support and therefore its geometry.

The gas distribution module includes a thermal drain member positioned above the removable gas distribution plate and the support device, said thermal drain having, for example, a heat acquisition surface in contact with the removable gas distribution plate greater than 30% of the upper surface of the removable gas distribution plate and a heat distribution surface in contact with the support device greater than 20% of the upper surface of the removable gas distribution plate. This allows to improve the control of the temperature of the gas distribution system.

The microwave plasma-assisted modular deposition reactor for manufacturing synthetic diamond according to the invention comprises a substrate cooling control module, including a removable thermal resistance gas injection device, said removable thermal resistance gas injection device comprises one or more thermal resistance gas inputs and one or more thermal resistance gas outputs. This device allows to introduce different gas mixtures, vary the flow rates, and/or vary the thickness of the gas flow. This allows the cooling to be finely controlled at the growth surface. It can be easily replaced between two growths and adapted to the expected growth and is therefore particularly useful in the context of modulating the growth conditions. The advantage of this module is also that it is possible to replace this part without having to replace a whole set of parts connected to such a cooling module. This substrate cooling control module also allows the temperature of the growth surface to be modulated during growth. Finally, the advantage of using a removable thermal resistance gas injection device is that it is possible to easily vary several variables such as the output dimensions or the output density.

the substrate cooling control module comprises positioning means and the growth support includes, on its lower surface, recesses adapted to accommodate the positioning means.

the substrate cooling control module includes positioning means mobile in vertical translation.

The wave coupling means is located in the upper part of the first enclosure part and at least 25 cm from the bottom of the second enclosure part, preferably at least 35 cm from the base of the second enclosure part.

The invention also relates to a diamond synthesis method implementing a microwave plasma-assisted modular deposition reactor for manufacturing synthetic diamond, said method comprising a step of:

placing the one or more substrates on the growth support of the modular reactor according to the invention, operating the modular reactor, said operation comprising the following steps:

generating a pressure between 0.2 hPa and 500 hPa within the resonant cavity.

injecting microwaves in transmission mode T and at a power between 1 kW and 100 kW, for example, injecting oases, for example at a total flow rate of at least 500 cm$^3$ per minute, and operating cooling systems of the enclosure, the gas injection system and the substrate holder, as well as a substrate cooling control system to control the temperature of the one or more growth surfaces, and growing the diamond film.

In the case of a polycrystalline film growth, the method may include a step coalescing the crystals before the step of thickening the diamond film.

Other advantages and characteristics of the invention will appear upon reading the following description given by way of illustrative and non-limiting example, with reference to the appended figures.

Figure 3A:
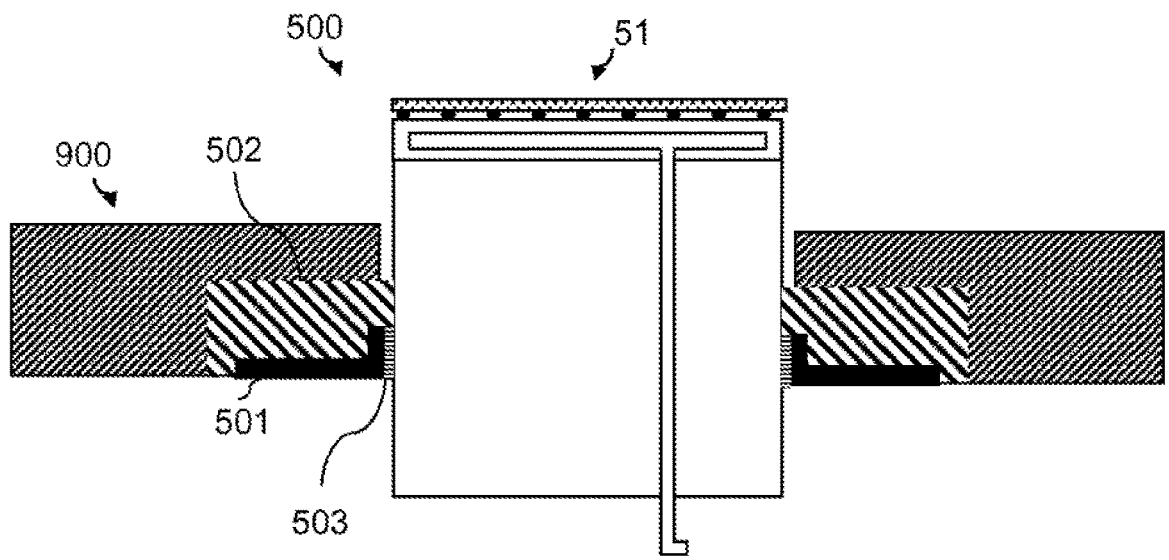
Figure 3B:
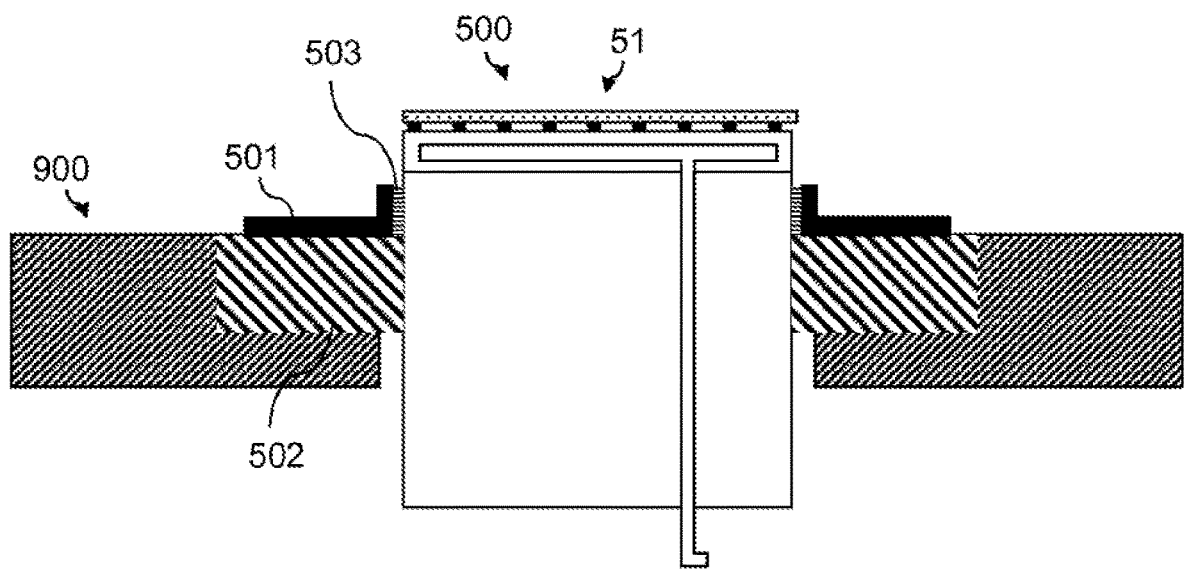
Figure 3C:
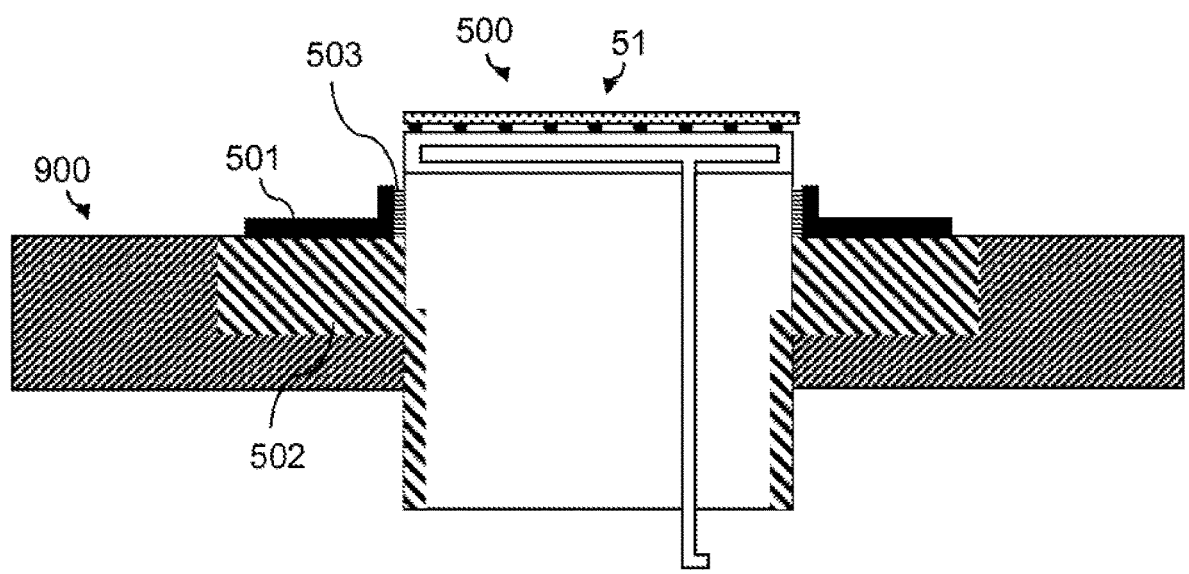

FIGS. 3A, 3B, and 3C, show the schematic cross-sectional views of a quarter-wave implemented with an electrical insulation system between the substrate holder and the tray according to three embodiments in a modular reactor according to the invention.

Figure 4:
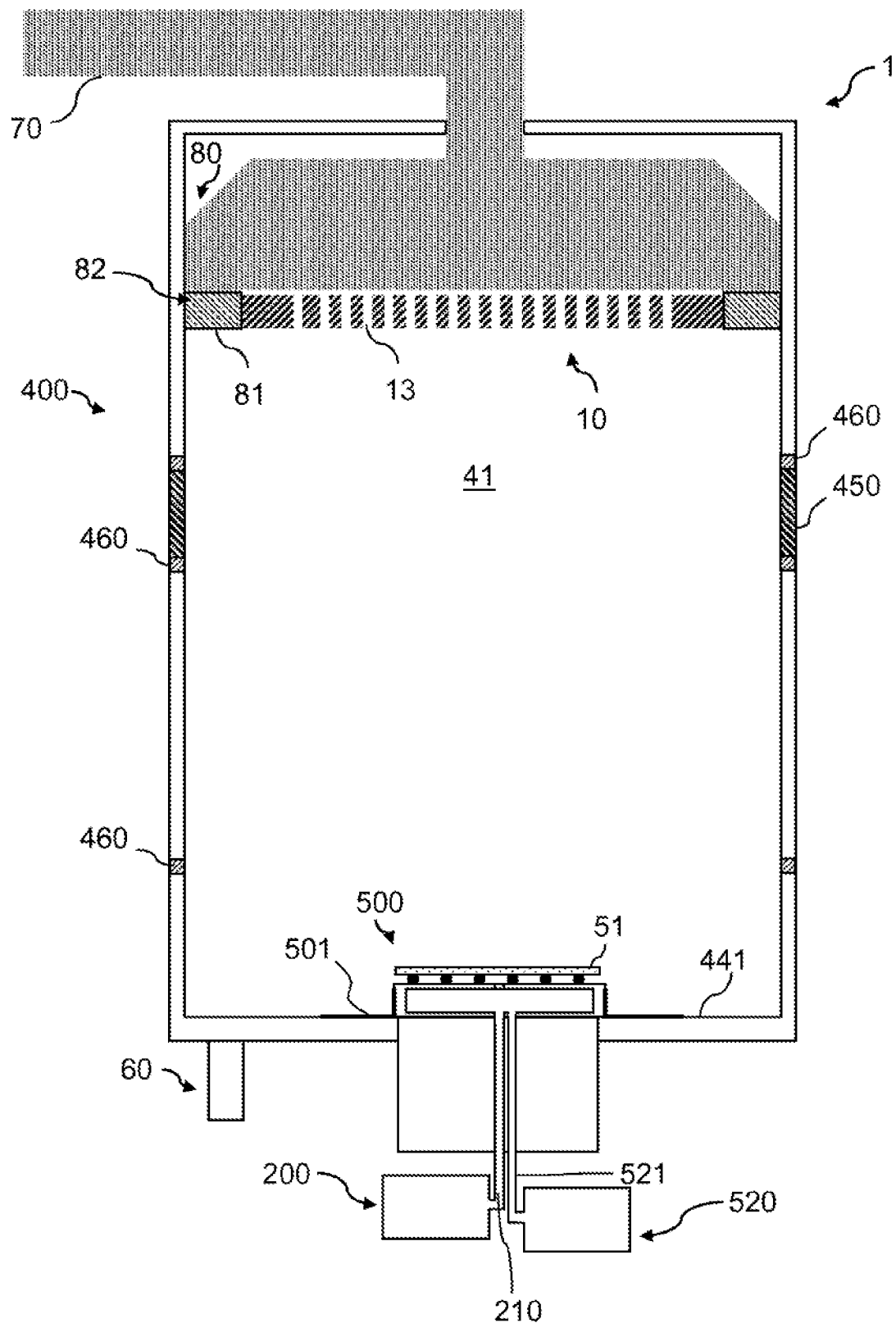

FIG. 4, shows the schematic cross-sectional view of a modular reactor according to the invention including a crown and a substrate holder module, which incorporates a thermal resistance gas cooling control system.

Figure 5A:
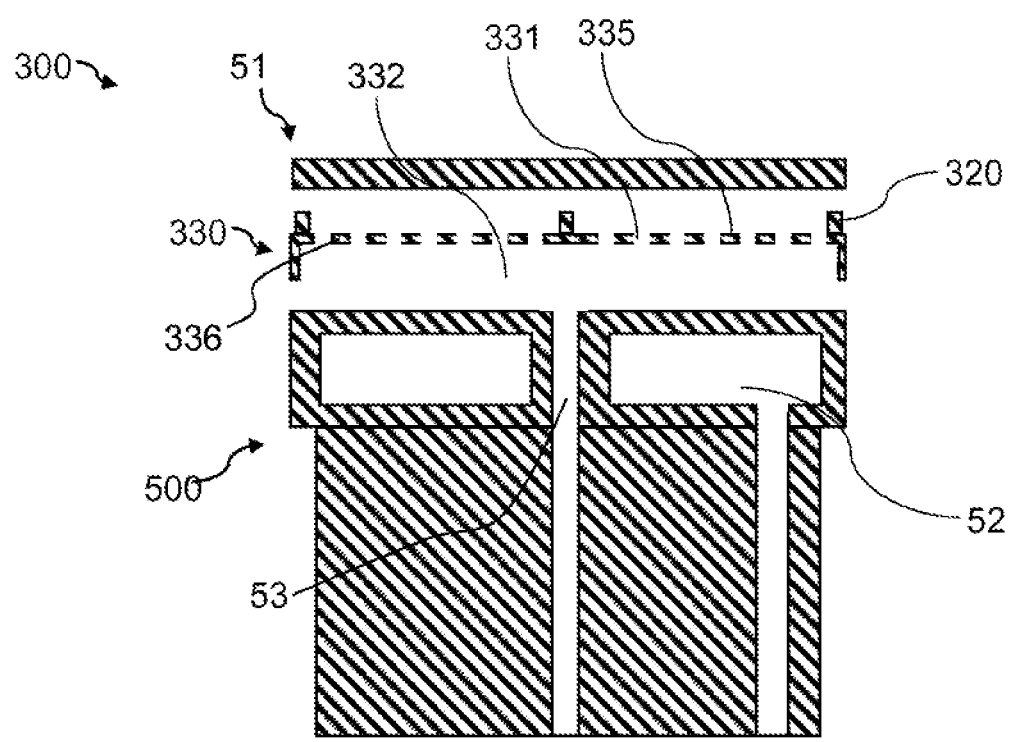
Figure 5B:
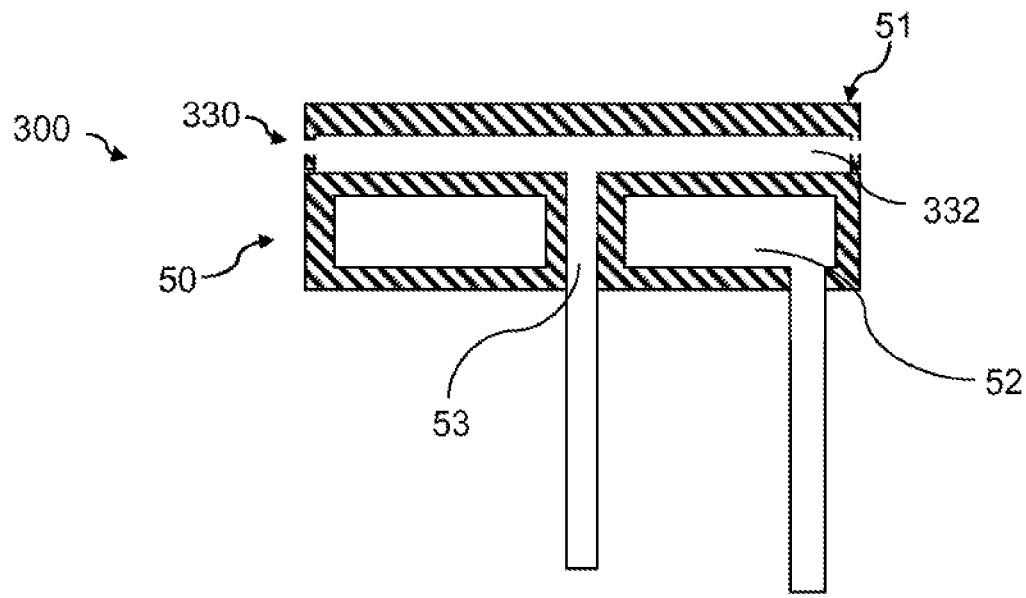

FIGS. 5A and 5B, snow the schematic view in a longitudinal section of two embodiments of the substrate cooling control module.

Figure 6A:
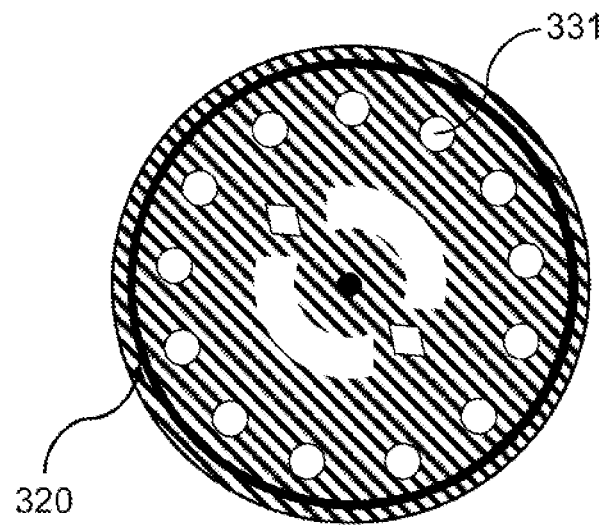
Figure 6B:
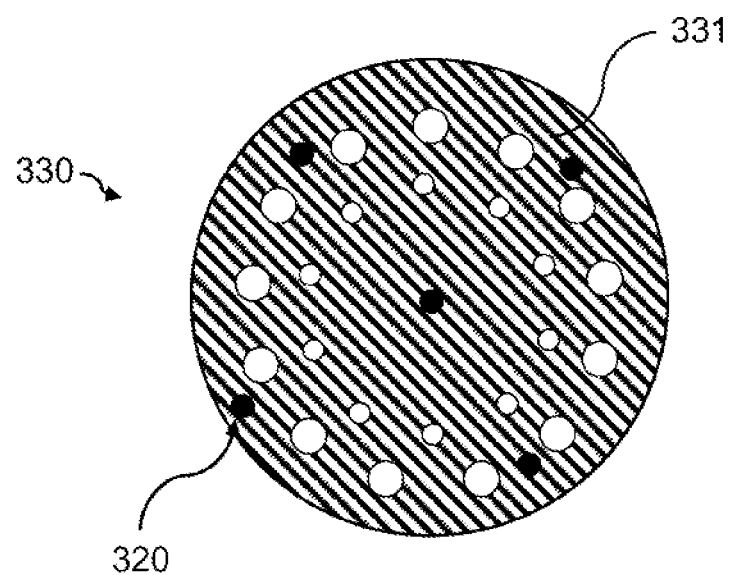

FIGS. 6A and 6B, show a top schematic view of two substrate cooling control modules.

Figure 7:
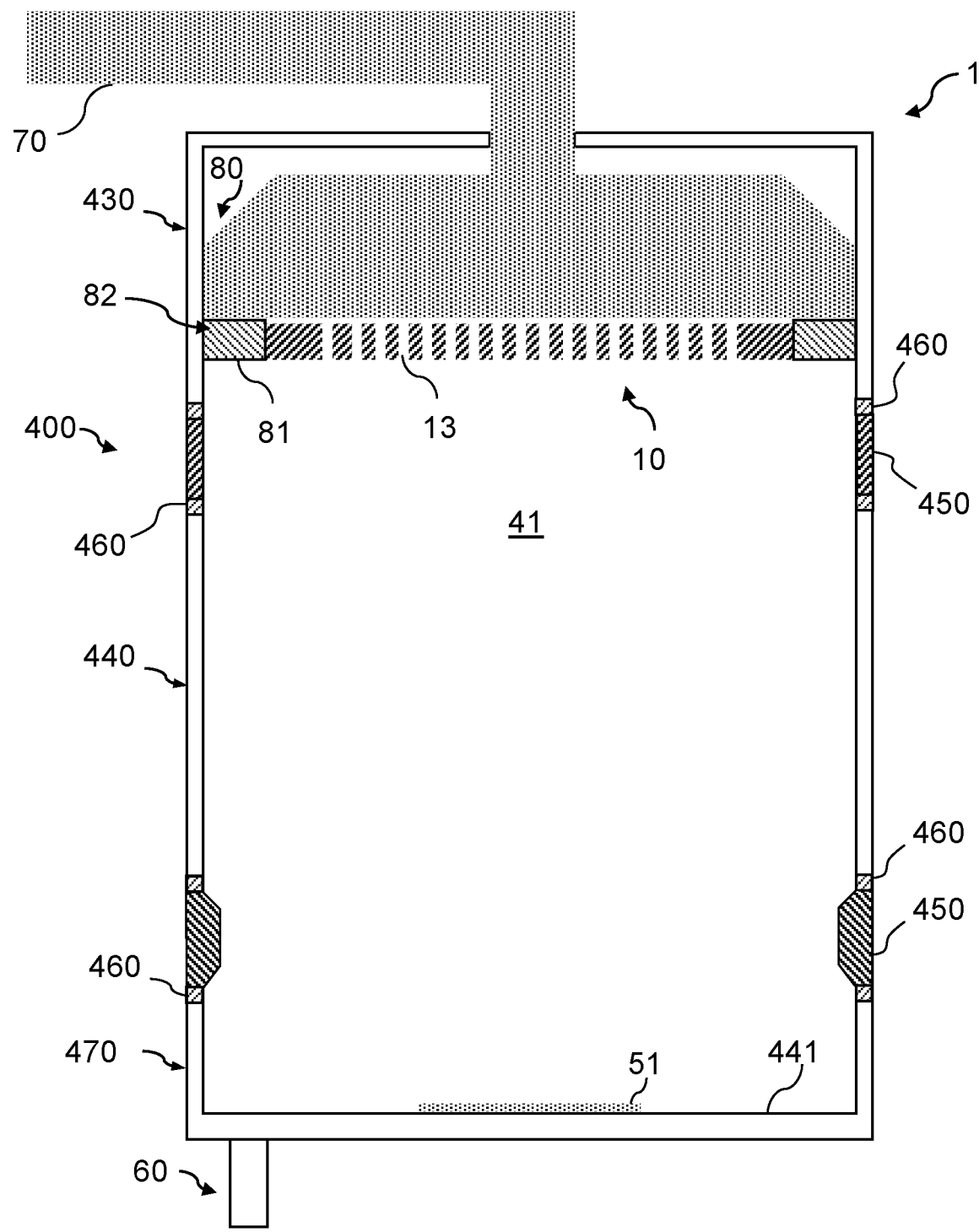

FIG. 7, shows the schematic cross-sectional view of a modular reactor according to the invention including a crown with a constant thickness in the upper part of the resonant cavity integrating a dielectric material and a crown having a projection in the lower part of the resonant cavity.

Figure 8:
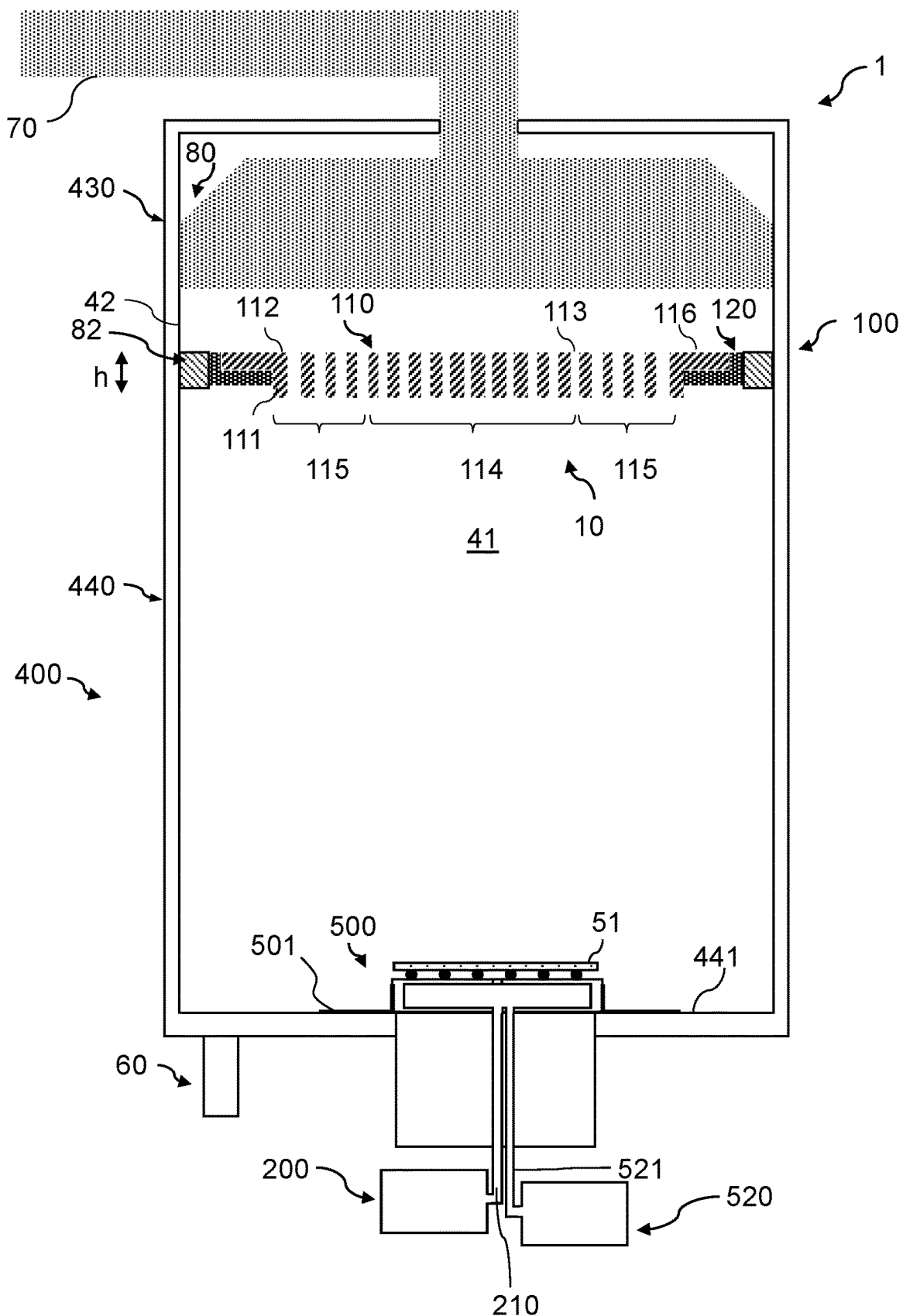
Figure 9:
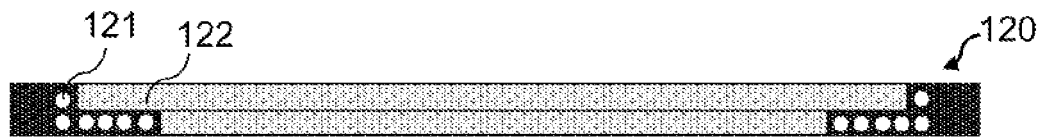

FIG. 8, shows the schematic cross-sectional view of a modular reactor according to the invention including a substrate holder module and a gas distribution module, FIG. 9, shows the schematic cross-sectional view of a support device of the removable gas distribution plate comprising channels capable of circulating a gas or liquid in said support device, to cool the distribution plate.

Figure 10A:
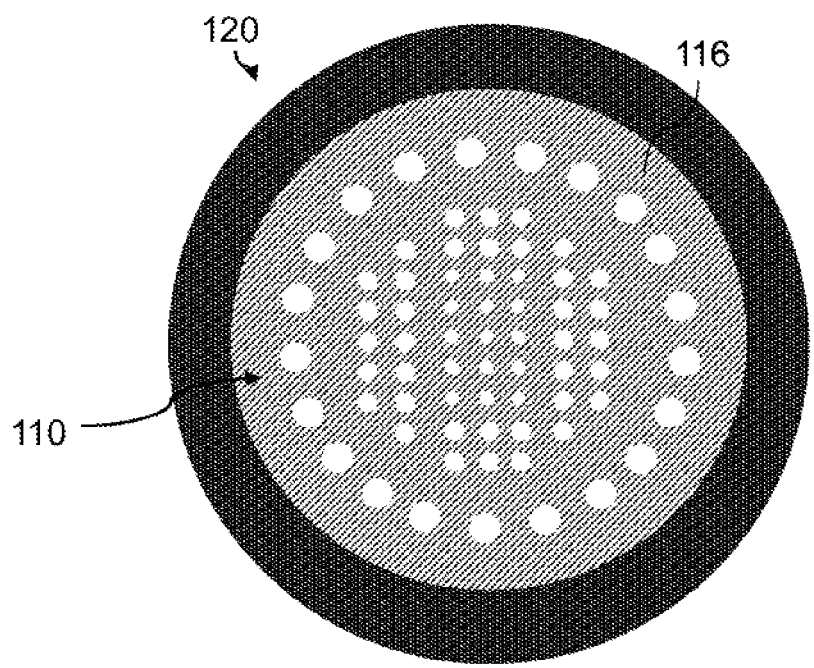
Figure 10B:
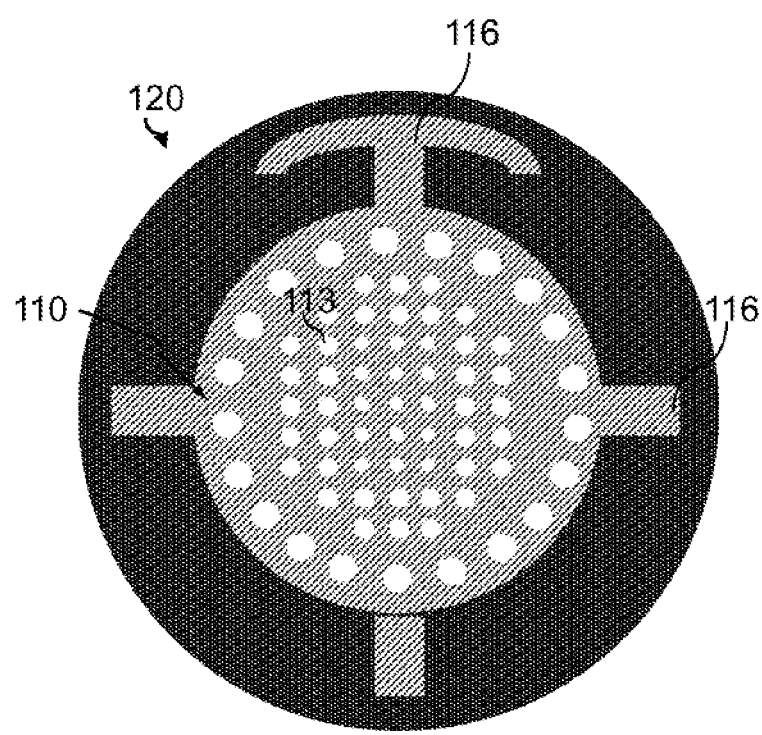

FIGS. 10A and 106, show the top schematic view of an assembly of a removable gas distribution plate and a support device, FIG. 10A: the removable gas distribution plate having a wide contact band with the support device over its entire circumference and without distribution nozzles, or FIG. 10B: point areas without nozzles.

Figure 11:
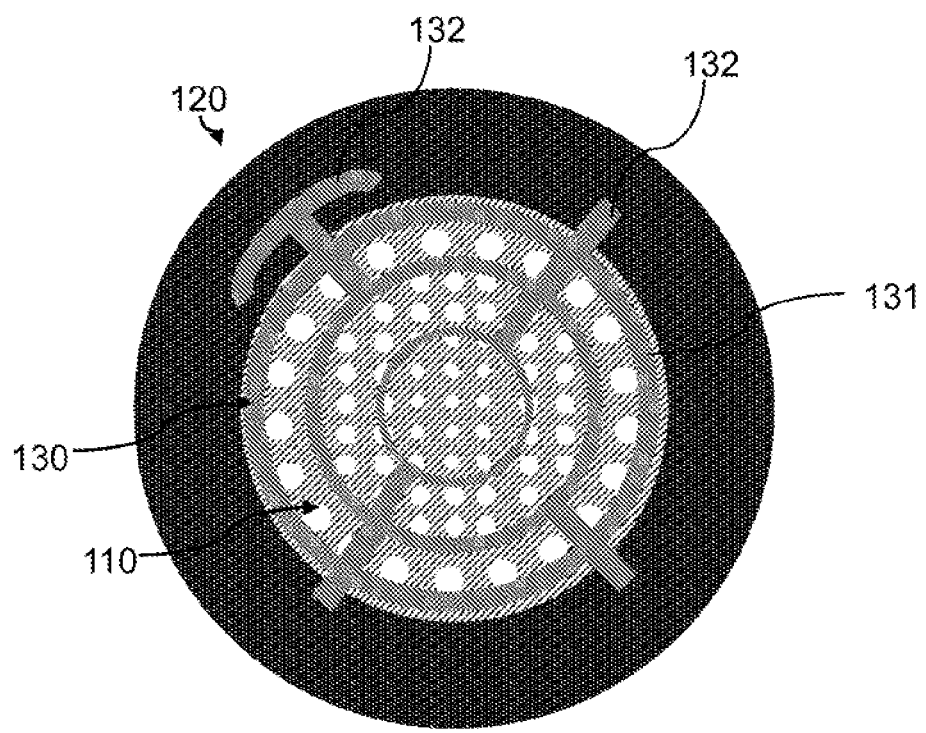

FIG. 11, shows the top schematic view of an assembly of a removable gas distribution plate and a support device, further comprising a thermal drain member.

Figure 12:
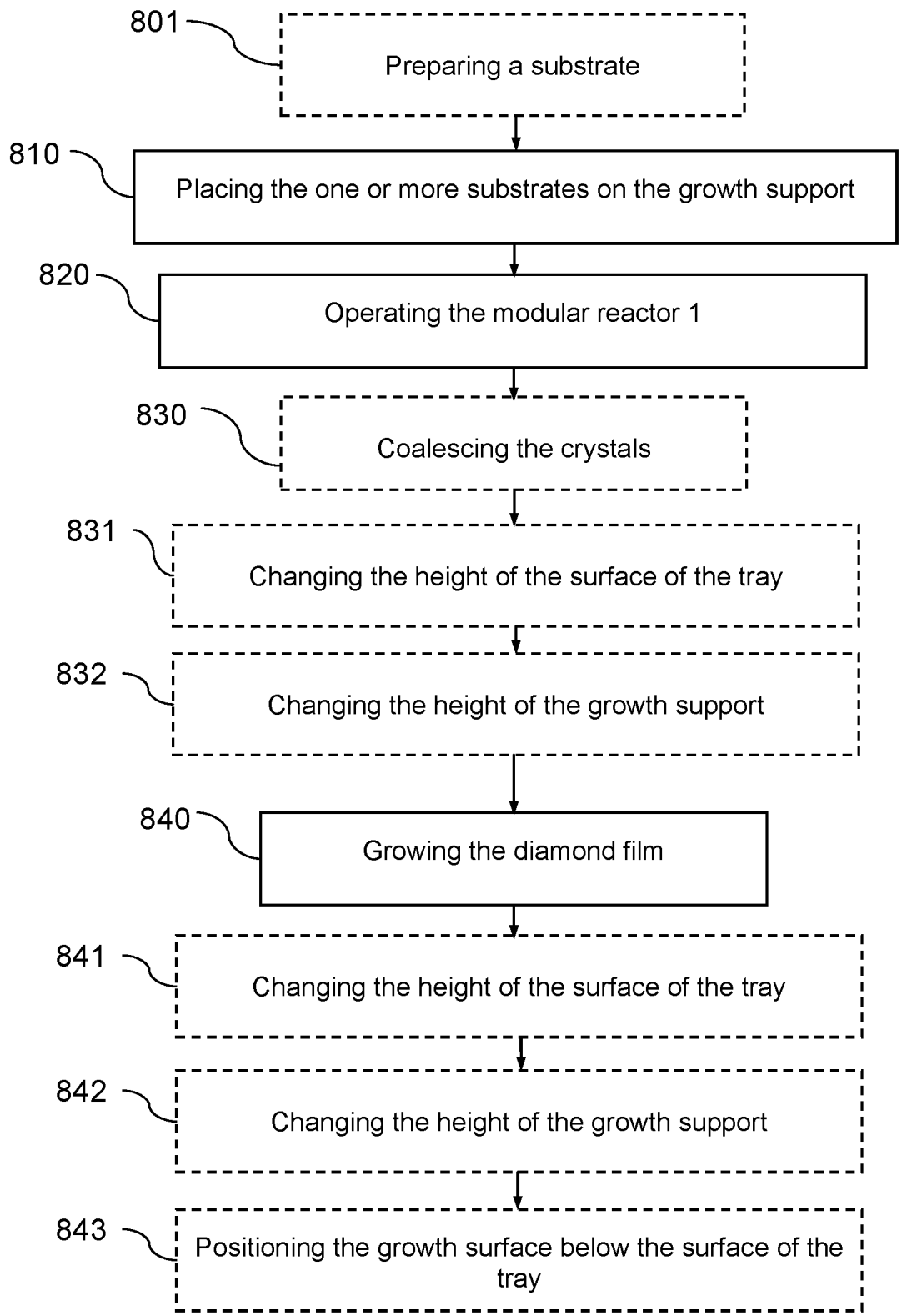

FIG. 12, shows the schematic view of a microwave plasma-assisted diamond deposition synthesis method according to the invention. The steps framed by dotted lines are optional.

DESCRIPTION OF THE INVENTION

In the remainder of the description, by "substantially identical" or "substantially equal" is meant a value varying by less than 30% with respect to the compared value, preferably by less than 20%, even more preferably by less than 10%. When substantially identical is used to compare shapes, then the vectorized shape, that is to say the shape without taking into account its dimensions, varies by less than 30% with respect to the compared vectorized shape, preferably by less than 20%, even more preferably by less than 10%.

The term "removable", within the meaning of the invention, corresponds to the ability to be easily detached, removed or disassembled without having to destroy attachment means either because there is no attachment means or because the attachment means are easily and quickly disassembled (e.g. notch, screws, tab, lug, clips). For example, by removable, must be understood that the object is not fixed by welding or by any other means not intended to allow the object to be detached.

The term "growth", within the meaning of the invention, corresponds to the one or more steps of depositing carbon in the crystalline (polycrystalline or single crystal) diamond sp3 form contributing to the production of a polycrystalline diamond layer, a diamond single crystal or nanocrystalline or ultra-nanocrystalline diamond.

The term "diamond", within the meaning of the invention, corresponds to one or more layers of polycrystalline or single crystal diamond of varying thickness, resulting from the deposition of carbon in the crystalline (polycrystalline or single crystal) diamond sp3 form. It should be noted that the "reactor" of the invention can also be used for the growth of nanocrystalline or ultra-nanocrystalline diamond, by adapting the growth conditions (temperature of the growing surface, gas composition, pressure and power conditions, etc.).

The expression "diamond film" or "diamond layer", within the meaning of the invention, corresponds to a layer (or film) of polycrystalline, nanocrystalline, or ultra-nanocrystalline diamond formed after nucleation on a non-diamond material surface (metal, silicon, silicon carbide, and the like), but also a single crystal or polycrystalline diamond surface. It also corresponds to obtaining single crystal diamond by thickening in height and/or width a seed diamond single crystal (or substrate) from a natural diamond single crystal, or produced by a high pressure-high temperature (HPHT) or CVD (chemical vapor deposition, plasma or hot filament-assisted, and the like) method.

The term "plasma", within the meaning of the invention, corresponds to the production, from an electrical discharge in a gas composed of a mixture of a medium generally electrically neutral, but containing ions and electrons, as well as fragments of dissociated gaseous species, as well as stable molecules.

The term "substrate", within the meaning of the invention, corresponds to the elements on which diamond layers or films grow. These are, for nanocrystalline or ultra-nanocrystalline polycrystalline films, non-diamond (metal, silicon, silicon carbide, and the like) or diamond materials in the case of a multilayer growth (multi-doping or multi-property or multi-color, etc.) and for single crystal films of natural diamond single crystals or produced by a high-pressure-high temperature (HPHT) or CVD (chemical vapor deposition, plasma or hot filament-assisted, and the like) method.

The expression "thermal resistance gas", within the meaning of the invention, corresponds to a gas mixture composed of pure gases with very different thermal conductivities allowing, by changing the composition, to change the thermal conductivity of the mixture.

The term "enclosure", within the meaning of the invention, corresponds to a vacuum chamber made of metal, preferably aluminum, intended to receive a gas mixture which, excited by an electric discharge, forms a plasma, one or more substrates to be treated by the plasma, and a growth support which can rest on a substrate holder (heated or cooled, possibly polarized). A pumping system ensures vacuum quality before the gases are introduced. The dimensions of the enclosure care be adapted to the microwave generator used, the coupler and the gas in which the energy is deposited.

The expression "resonant cavity", within the meaning of the invention, corresponds to a subpart of the volume formed by the enclosure, this subpart including in particular the place of formation of the plasma and the location of the one or more substrates. It is in the resonant cavity that growth is achieved. The resonant cavity depends on an assembly composed by a microwave generator, the applicator, and the impedance matching system, the gas source where the microwave energy is deposited within the enclosure, the resonant cavity consists of a part of the enclosure and elements such as the growth support, the substrate holder and the mobile tray.

The expression "growth surface", within the meaning of the invention, corresponds to the surface located in the resonant cavity and intended for the growth of single crystal diamond or non-diamond surfaces (polycrystalline diamond growth).

The expression "growth support", within the meaning of the invention, corresponds to an element, preferably metallic, for example made of molybdenum, intended to accommodate the one or more substrates. This growth support can rest on a substrate holder, for example via the thermal resistance gas injection device.

The expression "substrate holder", within the meaning of the invention, corresponds to a device, preferably cylindrical, which can be cooled by a heat transfer fluid such as silicone oil or water, loaded with additives or not, be associated with elements for adjusting the cooling of the one or more substrates and/or elements for applying a voltage or electrically insulating it from the resonant cavity.

By "modular", must be understood, within the meaning of the invention, a system consisting of an assembly of modules, wherein said modules can be independently added or separated from the system. The module being a subpart of the system constituting a unit both structural and functional. The modules can be autonomous or interconnected. In this case, any interconnection between the modules and the system or between the modules is removable within the above-mentioned meaning. The possibilities of the system can be expanded or changed by adding these modules.

In the following description, the same references are used to designate the same elements.

Figure 1:
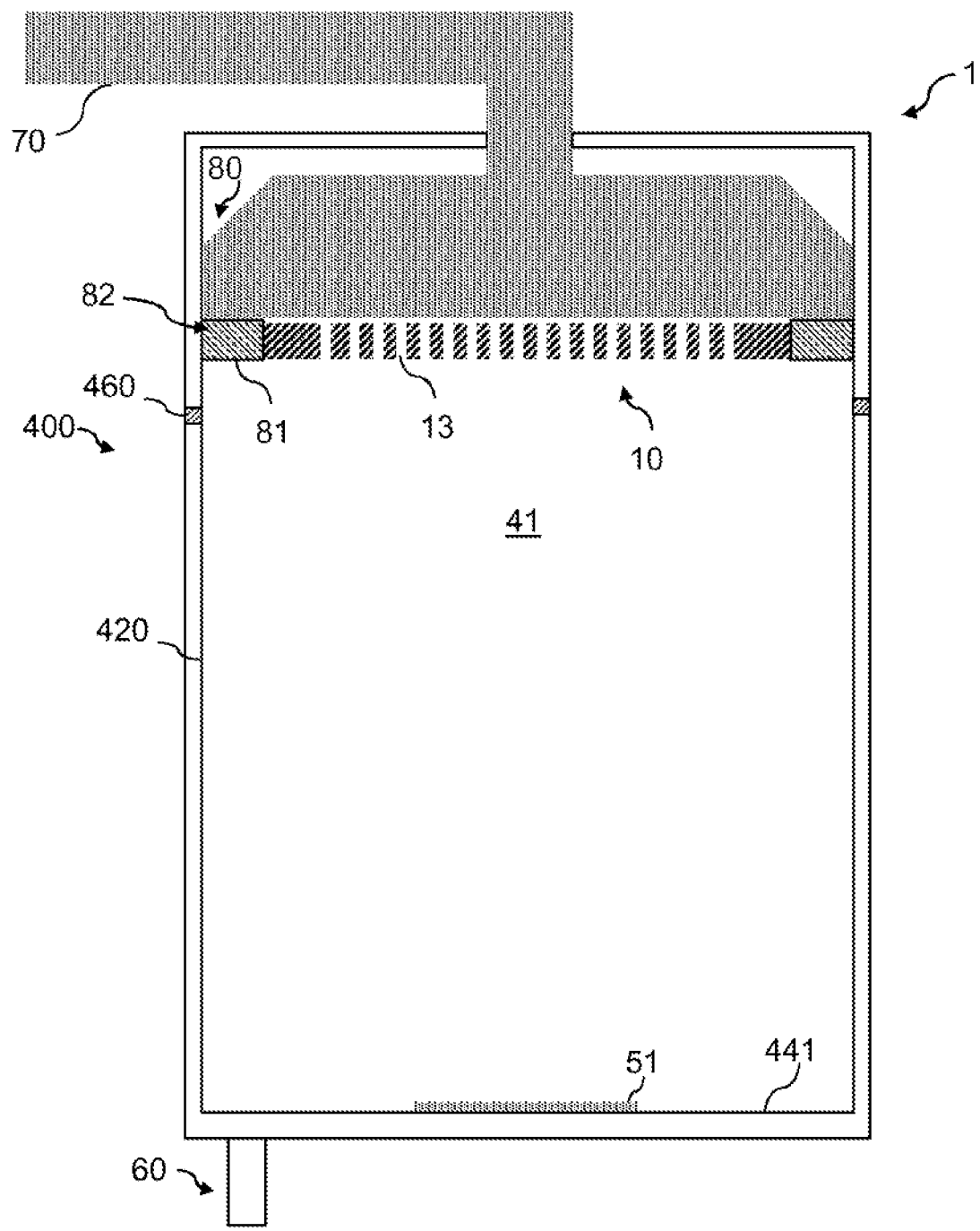
FIG. 1, shows the schematic cross-sectional view of an exemplary reactor according to the state of the art.

FIG. 1 illustrates a cross-sectional view of a microwave plasma-assisted deposition reactor for growing diamond as can be found in the literature.

A microwave plasma-assisted deposition reactor for manufacturing synthetic diamond generally comprises:
- a microwave generator 70 configured to generate microwaves, the frequency of which is between 300 MHz and 3000 MHz,
- a resonant cavity 41, preferably cylindrical and cooled, formed, at feast in part, by the cylindrical inner walls 420 of an enclosure 400 of the modular reactor 1,
- a gas inlet system 10 capable of supplying gases within the resonant cavity 41,
- a gas output module 60 capable of removing said gases from the resonant cavity 41,
- a wave coupling module 80 capable of transferring the microwaves from the microwave generator into the resonant cavity 41, in order to allow the formation of a plasma, and
- a growth support 51 present in the resonant cavity 41.

Microwave-assisted deposition reactors allow the resonance of a standing wave created within the resonant cavity 41. This resonance is possible thanks to a precise selection of the dimensions of the resonant cavity 41 and it allows the creation of standing waves of the electric field. These reactors are configured to allow a maximum electric field within the resonant cavity 41, preferably slightly above the growth support 51. Microwave electromagnetic field excitation, unlike radio frequency excitation, allows to very strongly limit the action of ions on surfaces, particularly on growth surfaces. Indeed the electron and on frequency is lower than that of the exciter wave, and the ions and electrons cannot follow the time variation of the electromagnetic field. The average electron energy is generally lower than that obtained with radio frequency excitation.

Thus, it is accepted in the literature that the dimensions of the cavity and the composition of the gas mixture and the operating conditions of a reactor are essential criteria for an optimum resonance and therefore for an optimum diamond growth. In fine with this teaching, reactors are, if possible, conceptualized, and then their performance is evaluated via modeling software for predicting the plasma behavior. Once the dimensions and the composition of the plasma-forming gas have been determined, the reactor is built and its dimensions no longer change. In addition, it has been shown that the pressure, the power coupled with the plasma, and many other variables such as the flow velocity, the optimum position of the substrate in interaction with the dimensions of a reactor are able to influence the hydrogen and methyl radical density, the thickness of the diffusion boundary layer, the substrate surface temperature and consequently the diamond layer growth.

Contrary to this teaching line, the inventors have developed a modular reactor for microwave plasma-assisted deposition. They have developed a modular reactor 1 for microwave-assisted deposition comprising several modulation elements that can be rapidly substituted and/or able to change the characteristics of the reactor (e.g. the dimensions of the resonant cavity 41) in order to adapt the plasma to the desired growth. Thus, a single reactor can then have modular specifications for optimizing the operation for several applications or even for improving, for a same application, the conditions during growth and this without having to be modified in its structure. For example, the modularity allowing the tray 900 to be moved and thus the height of the enclosure to be changed can lead to the use of the multimode operation of the system which allows the characteristics of the plasma, and therefore the growth conditions, to be changed temporarily or not. Similarly, the introduction of disturbing elements into the resonant cavity 41 allows the characteristics of the plasma, and therefore the growth conditions to be changed temporarily or not.

The microwave plasma-assisted deposition reactor 1 according to the invention comprises at least two modulation elements, sad modulation elements being selected from:
  a crown 450 adapted to be positioned between a first enclosure part 430 and a second enclosure part 440 in order to change the shape and/or volume of the resonant cavity 41, and a seal system 460, allowing for the vacuum tightness and electrical continuity of the walls of the enclosure, being arranged between the crown 450 and the first enclosure part 430 and the second enclosure part 440, respectively;
  a substrate holder module 500, mobile in vertical translation and in rotation, in contact with a quarter-wave 501 and including at east one fluid cooling system 520;
  tray 900 mobile in vertical translation in order to change the shape and volume of the resonant cavity 41 and including through openings 911 allowing the gases to pass;
  a gas distribution module 100, including:
    a removable gas distribution plate 110 comprising an inner surface 111, an outer surface 112, and a plurality of gas distribution nozzles 113 forming channels between said surfaces 111, 112 capable of conducting a gas flow, and
    a support device 120 adapted to accommodate the removable gas distribution plate 110; and
  a substrate cooling control module 300, including a removable thermal resistance gas injection device 330, said removable thermal resistance gas injection device 330 comprises one or more thermal resistance gas inputs 333 and one or more thermal resistance gas outputs 331.

The presence of these modulation elements within the reactor according to the invention allows the user to easily change some characteristics of the reactor without having to disassemble it entirely or call the manufacturer.

Preferably, the microwave plasma-assisted deposition reactor 1 according to the invention comprises at least three modulation elements specified above. More preferably, it includes at east four modulation elements specified above, and even more preferably it includes the five modulation elements specified above.

Alternatively, the microwave plasma-assisted deposition reactor 1 according to the invention comprises a tray 900 mobile in vertical translation in order to change the shape and volume of the resonant cavity 41 and including through openings 91 allowing the gases to pass, and at least one, preferably at least two, modulation elements selected from:
  a substrate holder module 500 mobile in vertical translation and in rotation, in contact with a quarter-wave 501 and including at least one fluid cooling system 520;
  a crown 450 adapted to be positioned between a first enclosure part 430 and a second enclosure part 440 in order to change the shape and/or volume of the resonant cavity 41, and a seal system 460, allowing for the vacuum tightness and electrical continuity of the walls of the enclosure, being arranged between the crown 450 and the first enclosure part 430 and the second enclosure part 440, respectively:
  a gas distribution module 100 including:
    a removable gas distribution plate 110 comprising an inner surface 111, an outer surface 112, and a plurality of gas distribution nozzles 113 forming channels between said surfaces 111, 112 capable of conducting a gas flow, and
    a support device 120 adapted to accommodate the removable gas distribution plate 110; and
  a substrate cooling control module 300, including a removable thermal resistance gas injection device 330, said removable thermal resistance gas injection device 330 comprises one or more thermal resistance gas inputs 333 and one or more thermal resistance gas outputs 331.

Preferably, the microwave plasma-assisted deposition reactor 1 according to the invention comprises a tray 900 mobile in vertical translation in order to change the shape and volume of the resonant cavity 41 and including through openings 911 allowing the gases to pass, and a substrate holder module 500, mobile vertical translation and in rotation, in contact with a quarter-wave 501 and including at least one fluid cooling system 520. These two modulation elements are preferably mobile, for example, in vertical translation and independently. That is to say that the tray 900 can be moved without affecting the position of the substrate holder module 500, and vice versa.

More preferably, the microwave plasma-assisted deposition reactor 1 according to the invention includes a tray 900 mobile in vertical translation in order to change the shape and volume of the resonant cavity 41 and including through openings 911 allowing the gases to pass, and a substrate holder module 500, mobile in vertical translation and in rotation, in contact with a quarter-wave 501 and including at least one fluid cooling system 520, and a substrate cooling control module 300, including a removable thermal resistance gas injection device 330, said removable thermal resistance gas injection device 330 comprises one or more thermal resistance gas inputs 333 and one or more thermal resistance gas outputs 331.

Alternatively, the microwave plasma-assisted deposition reactor 1 according to the invention comprises a substrate holder module 500, mobile in vertical translation and in rotation, in contact with a quarter-wave 501 and including at least one fluid cooling system 520, and at least one, preferably at least two, modulation elements selected from;
  a tray 900 mobile in vertical translation in order to change the shape and volume of the resonant cavity 41 and including through openings 911 allowing the gases to pass;
  a crown 450 adapted to be positioned between a first enclosure part 430 and a second enclosure part 440 in order to change the shape and/or volume of the resonant cavity 41, and a seal system 460, allowing for the tightness both from the vacuum point of view and the electrical point of view of the enclosure, being arranged between the crown 450 and the first enclosure part 430 and the second enclosure part 440, respectively;

a gas distribution module 100 including:
- a removable gas distribution plate 110 comprising an inner surface 111, an outer surface 112, and a plurality of gas distribution nozzles 113 forming channels between said surfaces 111, 112 capable of conducting a gas flow, and
- a support device 120 adapted to accommodate the removable gas distribution plate 110; and a substrate coding control module 300, including a removable thermal resistance gas injection device 330, said removable thermal resistance gas injection device 330 comprises one or more thermal resistance gas inputs 333 and one or more thermal resistance gas outputs 331.

Preferably, the microwave plasma-assisted deposition reactor 1 according to the invention comprises a substrate holder module 500, mobile in vertical translation and in rotation, in contact with a quarter-wave 501 and including at feast one fluid cooling system 520, and a substrate cooling control module 300, including a removable thermal resistance gas injection device 330, said removable thermal resistance gas injection device 330 comprises one or more thermal resistance gas inputs 333 and one or more thermal resistance gas outputs 331.

Alternatively, the microwave plasma-assisted deposition reactor 1 according to the invention comprises a crown 450 adapted to be positioned between a first enclosure part 430 and a second enclosure part 440 in order to change the shape and/or volume of the resonant cavity 41, and a seal system 460, allowing for the vacuum tightness and electrical continuity of the walls of the enclosure, being arranged between the crown 450 and the first enclosure part 430 and the second enclosure part 440, respectively: and at least one, preferably at least two, modular elements selected from:
- a tray 900 mobile in vertical translation in order to change the shape and volume of the resonant cavity 41 and including through openings 911 allowing the gases to pass;
- a substrate holder module 500, mobile in vertical translation and in rotation, in contact with a quarter-wave 501 and including at least one fluid cooling system 520;
- a gas distribution module 100 including:
  - a removable gas distribution plate 110 comprising an inner surface 111, an outer surface 112, and a plurality of gas distribution nozzles 113 forming channels between said surfaces 111, 112 capable of conducting a gas flow, and
  - a support device 120 adapted to accommodate the removable gas distribution plate 110; and
- a substrate coding control module 300, including a removable thermal resistance gas injection device 330, said removable thermal resistance gas injection device 330 comprises one or more thermal resistance gas inputs 333 and one or more thermal resistance gas outputs 331.

Alternatively, the microwave plasma-assisted deposition reactor 1 according to the invention comprises a gas distribution module 100, including a removable gas distribution plate 110 comprising an inner surface 111, an outer surface 112, and a plurality of gas distribution nozzles 113 forming channels between said surfaces 111, 112 capable of conducting a gas flow, and a support device 120 adapted to accommodate the removable gas distribution plate 110, and at least one, preferably at least two, modulation elements selected from:
- a tray 900 mobile in vertical translation in order to change the shape and volume of the resonant cavity 41 and including through openings 911 allowing the gases to pass;
- a substrate holder module 500, mobile in vertical translation and in rotation, in contact with a quarter-wave 501 and including at least one fluid cooling system 520;
- a crown 450 adapted to be positioned between a first enclosure part 430 and a second enclosure part 440 in order to change the shape and/or volume of the resonant cavity 41, and a seal system 460, allowing for the vacuum tightness and electrical continuity of the walls of the enclosure, being arranged between the crown 450 and the first enclosure part 430 and the second enclosure part 440, respectively;
- a substrate cooling control module 300, including a removable thermal resistance gas injection device 330, said removable thermal resistance gas injection device 330 comprises one or more thermal resistance gas inputs 333 and one or more thermal resistance gas outputs 331.

Alternatively, the microwave plasma-assisted deposition reactor 1 according to the invention comprises a substrate cooling control module 300, including a removable thermal resistance gas infection device 330, said removable thermal resistance gas injection device 330 comprises one or more thermal resistance gas inputs 333 and one or more thermal resistance gas outputs 331, and at least one, preferably at least two, modulation elements selected from:
- a tray 900 mobile in vertical translation in order to change the shape and volume of the resonant cavity 41 and including through openings 911 allowing the gases to pass;
- a substrate holder module 500, mobile in vertical translation and in rotation, in contact with a quarter-wave 501 and including at least one fluid cooling system 520;
- a crown 450 adapted to be positioned between a first enclosure part 430 and a second enclosure part 440 in order to change the shape and/or volume of the resonant cavity 41, and a seal system 460, allowing for the vacuum tightness and electrical continuity of the walls of the enclosure, being arranged between the crown 450 and the first enclosure part 430 and the second enclosure part 440, respectively:
- a gas distribution module 100 including:
  - a removable gas distribution plate 110 comprising an inner surface, an outer surface 112, and a plurality of gas distribution nozzles 113 forming channels between said surfaces 111, 112 capable of conducting a gas flow, and
  - a support device 120 adapted to accommodate the removable gas distribution plate 110.

In addition to these modulation elements specific to the invention for providing quickly and at a lower cost a reactor that can be optimized for a wide range of growth conditions, the reactor according to the invention includes the essential components of any microwave plasma-assisted deposition reactor.

The microwave generator 70 is configured to generate microwaves, the frequency of which is between 300 MHz and 3000 MHz. These microwaves are essential for creating standing waves of electric field within the cavity. Preferably, the microwave generator 70 is configured to generate microwaves, the frequency of which is between 400 MHz and 2700 MHz. Even more preferably, the generator is configured to generate microwaves, the frequency of which is between 900 MHz and 1000 MHz in order to increase the benefit of the modularity provided by the reactor according to the invention. Indeed, the reactor 1 according to the invention is particularly advantageous for large size reactors such as those operating at frequencies between 900 MHz and 1000 MHz, or between 300 MHz and 500 MHz. A modular reactor 1 according to the invention coupled with such generators allows to provide a set of manufacturing options never seen before and thus meet the needs of a wider variety of industries.

For example, the generator can generate microwaves, the frequency of which is substantially equal to 2450 MHz, 515 MHz or 433 MHz.

There is a large number of generators that can be used as the reactor 1 according to the invention. The generator used can be, for example, a microwave generator capable of delivering a power of up to 6 kW and this at a frequency substantially equal to 2450 MHz. Another microwave generator capable of delivering a power of up to 30 kW, 50 kW or even 100 kW and this at a frequency substantially equal to 915 MHz can also be used. Also, another microwave generator operating at a frequency substantially equal to 433 MHz can be used.

The microwave supply of the cavity, or coupling, is carried out by a wave coupling module 80 capable of transferring the microwaves from the microwave generator 70 into the resonant cavity 41 in order to allow the formation of a plasma. The coupling module allows to inject, into the resonant cavity 41, the wave generated by the microwave generator 70 and to this end it includes a wave guide, a coaxial transition, and a microwave coupler to convey and guide the electromagnetic waves from the wave generator 70 into the resonant cavity 41. The propagation modes provided by the waveguide can be of two types:

the magnetic transverse mode ($TM_{0mn}$), the axis of the magnetic field is perpendicular to the axis of the cavity, the incident magnetic field is perpendicular to the incidence plane (then the electric field is in the incidence plane), and the electric transverse mode ($TE_{0mn}$), the axis of the electric field is perpendicular to the axis of the cavity, and the incident electric field is perpendicular to the incidence plane (then the magnetic field is in the incidence plane).

The indices m and n indicate the number of maxima of the sinusoidal variations of the electric field radially and along the axis of the resonant cavity 41 for the transverse mode TM0mn, respectively. For a description of the different modes that can be used, the person skilled in the art can refer to Silva et al. (Silva et al. 2009; Microwave engineering of plasma-assisted CVD reactors for diamond deposition. Journal of Physics: Condensed Matter or to J. Asmussen, Chap 6 of High density plasma sources, edit O A Popov, Noyes publications, 1995). The TM0mn modes allow axisymmetric plasmas to be obtained. The coupling is preferably carried out by means of a dielectric window and preferably the waveguide system is cooled, for example by a cooling means including a liquid. The possible and optimum couplings for microwave plasma-assisted deposition reactors are described in the literature (Kudela terebessy et al Applied Physics Letter vol 80, No 7, 2002; D G Goodwin J. Appl. Phys. 74-11, 1993; H. Yamada, et al., DRM, 17, 2008; X. Li, et al. Physics procedia 22, 2011; J. Wang et al., DRM 30, 2012; Yutaka Ando et al., DRM, 11, 2002; Takeshi Tachibanaa et al. Diamond and Related Materials 10 2001).

Preferably, the coupling mode in the reactor 1 (that is to say in the resonant cavity 41) according to the invention is configured in order to be single-mode at the time of ignition of the plasma, more preferably in magnetic transmission mode. Even more preferably, the system is initially configured to operate in $TM_{011}$ mode, that is to say with only one electric field maximum on the reactor axis and on the radial component. The advantage of using the $TM_{011}$ mode as part of the invention is that it is easy to create a plasma that has a shape adapted to diamond deposition. Indeed, in order to allow a significant energy deposition at the plasma/surface interface, the plasma cannot have a thickness much greater than the penetration thickness of the wave.

Preferably, the wave coupling module 80 is positioned above the resonant cavity 41 and includes a dielectric wave injection window 82, the face 81 of which is positioned parallel to the growth support 51, and offset towards the outside in order to limit the heating effect of the window due to natural convection occurring in the core of the plasma that would lead to its engraving/deterioration and possible pollution of the diamond layers.

The enclosure 400 can have different shapes and sizes. Preferably, the enclosure 400 has a cylindrical shape, but it can take on other shapes. When the reactor 1 according to the invention includes the tray 900 as a modular element that allows to change the height of the resonant cavity 41. The height of the enclosure, as measured from the base 441 of the enclosure 440 up to the inner surface 81 of the wave guide, may be, for example, between 150 mm and 600 mm, preferably 200 mm and 500 mm, and more preferably between 350 mm and 450 mm. These latest dimensions are particularly preferred for operating at a microwave frequency in the range of 900 MHz to 1000 MHz. Similarly, in the following description of the present invention, unless indicated otherwise, the dimensions will be particularly adapted to a modular reactor 1 operating at frequencies between 900 MHz and 1000 MHz. Unless indicated otherwise, the preferred dimensions or the growth conditions for a modular reactor 1 operating at frequencies between 300 MHz and 500 MHz may be obtained by multiplying the dimensions adapted to a modular reactor 1 operating at frequencies between 900 MHz and 1000 MHz by a factor between 3.4 and 1.8. Unless indicated otherwise, the preferred dimensions or the growth conditions for a modular reactor 1 operating at frequencies between 2300 MHz and 2600 MHz may be obtained by dividing the dimensions adapted to a modular reactor 1 operating at frequencies between 900 MHz and 1000 MHz by a factor between 2.3 and 2.9.

The enclosure 400 according to the invention is generally made of metal, preferably made of aluminum or an aluminum alloy. The aluminum alloy preferably comprises at least 80%, more preferably at least 90%, and even more preferably at least 98% by weight of aluminum.

The resonant cavity 41 is formed, at least in part, by the cylindrical inner walls 420 of the enclosure 400 of the reactor 1. The resonant cavity 41 is formed for its lower part by the base 441 of the enclosure 400 or by the surface 910 of the tray 900. According to one embodiment, it also includes the substrate holder module 500, intended to accommodate the growth support and the one or more substrates, if its surface is in electrical continuity with the tray 90g and the walls of the enclosure and any metal element that may possibly be confined in the resonant cavity 41. The resonant cavity 41 is preferably cylindrical. The resonant cavity 41 has a symmetry axis from the plane of the base 441 of the enclosure to the plane of the surface 81 of the dielectric wave injection window 82 and is preferably adapted to a microwave resonance mode of the TM type. The base 441 may have a diameter different from the diameter of the resonant cavity 41.

The reactor 1 as shown in FIG. 1 also comprises a growth support 51 located in the resonant cavity 41. This growth support 51 can, for example, form a large flat surface on which the one or more substrates are to be positioned. This growth support 51 may include projections, circles, holes, or grooves, for aligning and maintaining the one or more substrates. Alternatively, the growth support 51 includes a flat support surface on which the one or more substrates are placed.

The microwave plasma-assisted deposition reactor includes a gas inlet system 10 capable of supplying gases within the resonant cavity 41. This gas inlet system 10 allows to implement a method where the process gases are injected towards the growth surface at a total gas flow rate of at least 100 cm$^3$ per minute. The gases provided within the resonant cavity 41 comprise at east one carbon source and one molecular hydrogen source. The carbon source is preferably methane. For a modular reactor 1 operating at frequencies between 900 MHz and 1000 MHz, the gas flow rate is preferably at least 750 cm$^3$ per minute, more preferably at least 1000 cm$^3$ per minute. Within the resonant cavity 41, these gases are activated by the microwaves to form a plasma in the regions of high electric field. Radicals containing reactive carbon can then diffuse from the plasma to be deposited on the one or more substrates and thus allow the diamond to grow.

The gas inlet system 10 allows to provide nitrogen into the resonant cavity 41, for example at least 0.3 ppm of nitrogen. The use of nitrogen within the resonant cavity 41 is known to increase the growth rate of diamond layers and allow for greater crystal stability.

The gas inlet system 10 can also allow the injection into the resonant cavity 41 of one or more so-called doping gases comprising elements such as boron, sulfur, phosphorus, silicon, lithium, and beryllium, and the like. Thus, the pas inlet system 10 allows to implement a method where the gases comprise at least one dopant at a concentration equal to or greater than 0.01 ppm. The use of such so-called dopant gases allows to change the properties of the synthesized diamond. This may, for example, change as optical and/or electronic properties.

The gas inlet system 10 can also allow the injection of other gases that may be advantageous for achieving certain growths such as argon, oxygen, or other gases usually used.

The gas output module 60 allows the gases present in the resonant cavity 41 to be evacuated, a comprises one or more gas outputs 61, preferably located in the lower part of the deposition reactor.

One or more gas outputs 61 can be located around and under the growth support 51, according to an axisymmetric arrangement.

The enclosure 400 of the microwave plasma-assisted modular deposition reactor according to the invention may consist of at feast two parts which, when assembled, partially form the resonant cavity 41.

Taking into account the temperature of the gas reached in the heart of the plasma (e.g. more than 2500K and up to 5000K), an extremely efficient cooling of the walls of the reactor is necessary.

The gas temperature of the plasma has an impact on the walls which are subjected to a high heat flow. To compensate for this, a wall cooling system is generally implemented.

The inventors propose to divide the enclosure into at least two parts each accommodating some of the elements necessary for operating the deposition reactor. For example, the first enclosure part 430 encompasses the gas inlet system 10 and the wave coupling module 80, while the second enclosure part 440 encompasses the gas output module 60, the growth support 51, the tray 900 and, where appropriate, the substrate holder.

Advantageously, the second enclosure part 440 is preferably removable without having to separate the pas inlet system 10 or the wave coupling module 80 from the first enclosure part 430.

In addition, the reactor 1 preferably includes a cooling system 490 configured to independently cool the first enclosure part 430 and the second enclosure part 440.

The cooling system 490 can also be configured to induce a higher temperature decrease on one of the two enclosure parts 430, 440.

Figure 2:
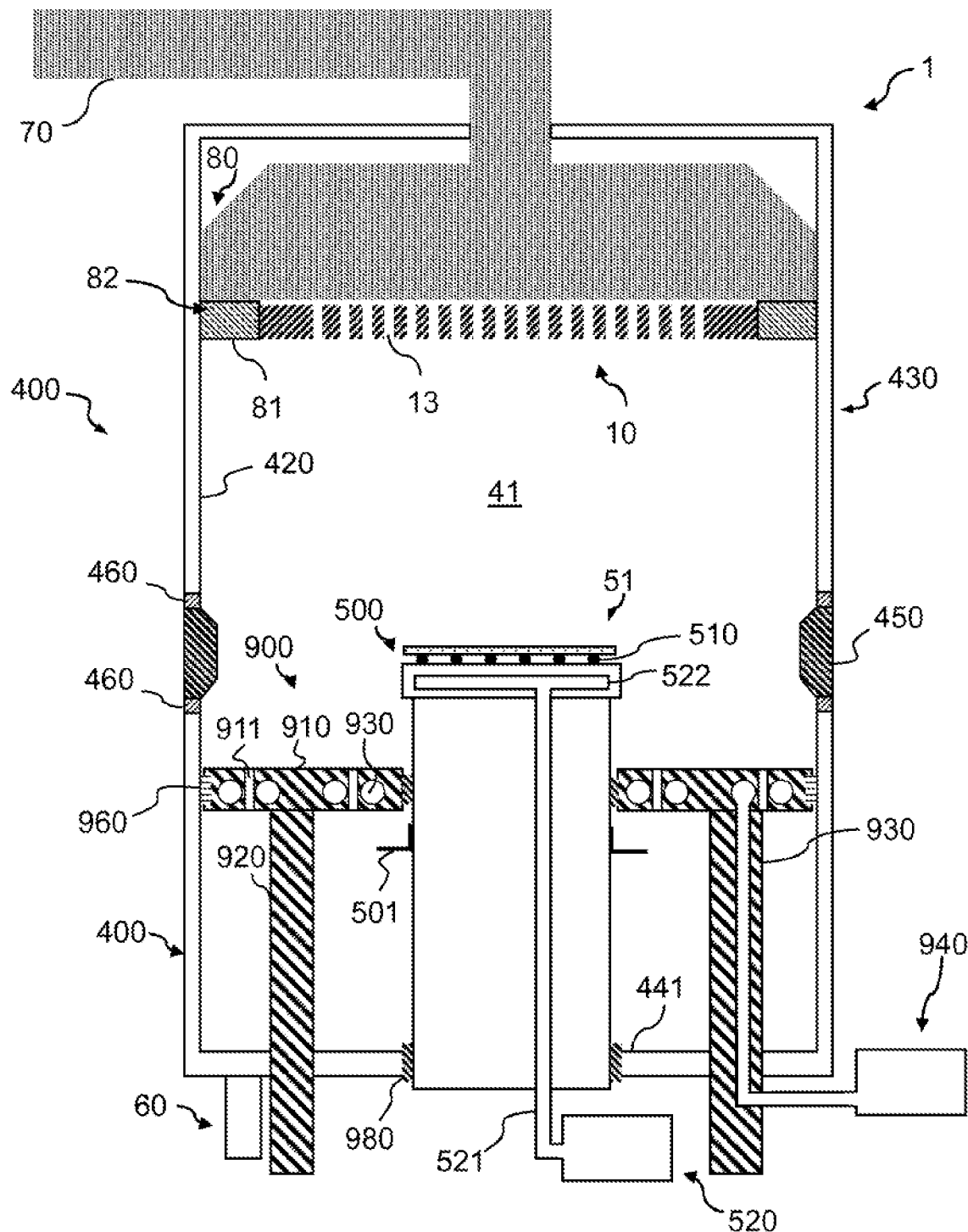
FIG. 2, shows the schematic cross-sectional view of a modular reactor according to the invention including a mobile tray, a substrate holder module and a crown.

As previously mentioned, one of the modulation elements proposed by the inventors is a tray 900 capable of moving in vertical translation in order to change the shape and volume of the resonant cavity 41. In addition, during the operation of the reactor, the tray is capable of modifying the shape and volume of the plasma. This tray 900 is shown in FIG. 2.

This tray 900 capable of moving in vertical translation has the advantage for the user of being able to quickly change the dimensions of the resonant cavity 41. However, changing the dimensions and shape of the resonant cavity 41 depending, for example, on the conditions for the gas composition, the pressure, the power, will lead to a change in the dielectric properties of the plasma and therefore in its shape and thus change the local growth conditions of the diamond film. The tray 900 according to the invention has the advantage of being able to be moved before growth, but also during growth. This allows the user to change the shape, characteristics and position of the plasma so that they are adapted for the position of the growling surface of the substrate and the synthesis step.

For example, the tray 900 can have a thickness between 1 and 10 cm. The thickness must not be too great in order to reduce the quantity of materials used for the manufacture, but it must also be sufficient to prevent the deformation of the tray 900 that could be induced by the plasma during the experiment and allow the placement of the one or more coding channels, where appropriate. Preferably, the tray 900 has a thickness between 2 cm and 8 cm.

The tray 900 can be made of different metallic materials. Preferably, it comprises molybdenum, copper, aluminum, and/or an aluminum alloy.

In addition, as shown in FIG. 2, the tray 900 according to the invention includes through openings 911 allowing the gases to pass. This is particularly advantageous when one or more gas outputs 61 are located in the lower part of the enclosure. Preferably, the tray 900 includes between 5 and 15 through holes 911. These through holes preferably have a cylindrical shape with a diameter between 1 and 5 cm. These through openings are advantageously vertical and for example perpendicular to the upper surface 910 of the tray 900.

Preferably, the through openings 911 are positioned at the ends of the tray, that is to say near the outer edge of the tray. In addition, the sum of the area of these through openings 911 on the upper surface of the tray 900 is preferably between 4 and 100 cm$^2$.

The tray 900 is able to move in translation, for example, thanks to cylinders 920 to which it is connected. These cylinders are preferably located outside the volume formed by the enclosure 400. They can be replaced by any mechanism allowing a slow and precise movement of the tray 900. The tray 900 can also be combined with bellows or a guidance system in order to improve its vertical translation movement.

The tray 900 can be subjected to very high temperatures during operation. Thus, in order to, on the one hand, limit or avoid its deformation and, on the other hand, to reduce plasma disturbance, the tray 900 may include at least one cooling channel 930 connected to a coding system 940 and capable of cooling said tray 900.

Advantageously, the tray 900 is removable. It can be easy removed and replaced by another tray 900 that can have different dimensions and/or shape and can be attached to the vertical translation system and/or the cooling system 940.

The surface of the tray 900 is preferably flat, but the tray 900 may have a recess in its center. Such a recess is adapted to accommodate a substrate holder so that the latter is precisely positioned within the cavity.

The tray 900 may include a subpart in the shape of a solid disc, but preferably, the tray 900 may have a subpart in the shape of a solid disc, the center of which has been deleted as shown in FIG. 2.

The tray 900 may have an upper face 910, the surface of which is greater than 50%, preferably greater than 60%, of the surface of the cross section of the enclosure 400 at the growth support 51. Thus, preferably, the tray 900 has an upper face 910, the surface of which is between 60% and 95% of the surface of the cross section of the enclosure 400 at the growth support 51, more preferably the surface is between 70% and 90% of the surface of the cross section of the enclosure 400 at the growth support 51, even more preferably the surface is between 80% and 90% of the surface of the cross section of the enclosure 400 at the growth support 51. These dimensions allow the plasma to be modulated more efficiently than with a reduced surface tray. These figures do not take into account the through openings 911.

Advantageously, the tray 900 has an upper surface 910 with an area larger than that of the growth support 51. Preferably, the tray 900 has an upper surface 910 with an area representing more than 1500% of the area of the growth support 51, and even more preferably, the tray 900 has an upper surface 910 with an area representing more than 550% of that of the growth support 51 for a 900-1000 MHz type reactor.

Advantageously, the tray 900 can include a system of elements 960 capable of maintaining electrical contact with the inner walls 420 of the enclosure 400 and thus maintaining electrical continuity with the enclosure, as well as with the substrate holder module 500 in the case where the substrate holder module 500 is an integral part of the resonant cavity 41. For example, these elements 960 can include or be made of a copper-beryllium alloy.

Another of the modulation elements proposed by the inventors is a substrate holder module 500, in contact with a quarter-wave 501 and including at least one fluid cooling system 520, configured to allow the vertical translation and rotation movement of the growth support 51. This substrate holder module 500 is shown in FIG. 2.

Advantageously, the substrate holder module 500 is removable and has the advantage of being easily removable from the reactor in order to be replaced by another removable substrate holder module 500, for example.

The substrate holder module 500 according to the invention has the advantage of being able to move in vertical translation. This vertical translation can be achieved by various means such as a motor or a manual actuator. This translation allows to improve temperature management of the growth surfaces and their homogeneity.

Preferably, the substrate holder module 500 has bellows 550 capable of ensuring the vertical translation mobility of the growth support 51. The bellows 550 are preferably located below the tray 900.

The substrate holder module 500 according to the invention also has the advantage of being able to move in rotation. This rotation can be achieved by various means such as, a motor or a manual actuator. Preferably, the substrate holder module 500 is connected to a motor connected to an axis of the substrate holder and located outside the volume formed by the enclosure 400 capable of ensuring the rotational mobility of the growth support 51.

In addition, the substrate holder module 500 is in contact with a quarter-wave 501 capable of limiting the propagation of microwaves outside the resonant cavity 41. A quarter-wave 501 is a metallic structure with a cylindrical symmetry forming a quarter-wave in the longitudinal section. A quarter-wave 501 according to the invention is shown in FIG. 2. The quarter-wave 501 is in direct or indirect contact with the substrate holder module 500 and it is preferably electrically connected to the substrate holder module 500, even more preferably it is in indirect contact and electrically connected to the substrate holder module 500 via an electrical conductor means 503. Advantageously, when the modular reactor 1 according to the invention includes a tray 900 and a substrate holder module 500, the quarter-wave 501 can be electrically insulated from the tray 900 and be electrically connected to the substrate holder module 500. The electrical insulation can be provided by an insulating means 502 including an electrical insulating material and capable of electrically insulating the tray 900 from the quarter-wave 501 and can for example comprise a PTFE (polytetrafluoroethylene) block or a PTFE seat. The electrical connection between the substrate holder module 500 and the quarter-wave 501 can be achieved by a conductive means 503 including an electrically conductive material and capable of conducting the electrical current between the substrate holder module 500 and the quarter-wave 501. The electrical connection between the substrate holder module 500 and the quarter-wave 501 is preferably achieved via a conductive means 503 including a mixture of copper and beryllium. Specific arrangements of the quarter-wave 501 within the modular reactor 1 are shown in FIG. 3. FIGS. 3A, 3B and 3C show that, preferably, the quarter-wave 501 is connected to the mobile tray 900 via an insulating means 502 and that it comes into contact with the substrate holder module 500 via a conductive means 503. The quarter-wave 501 can be positioned, for example, below (FIG. 3A) or above (FIGS. 3B and 3C) the mobile tray 900.

The substrate holder module 500 includes at least one fluid cooling system 520 capable of circulating a cooling heat transfer fluid (e.g. water) in the substrate holder module 500. This cooling fluid allows to control the temperature rise of the growth support 51 and therefore of the substrate. Preferably, the cooling fluid is a cooling fluid, which can be selected, for example, from: water, water added with additives, silicone oil, or the like. Preferably, a fluid distribution channel 521 is connected to a distribution chamber 522 capable of distributing the heat transfer fluid under the upper surface of the substrate holder module 500.

Cooling the growth support 51 by a fluid cooling system 520 is necessary, but does not generally allow for a sufficiently accurate control of the temperature of the growth support 51 and the growth surface of the one or more substrates. Thus, as shown in FIG. 4, the substrate holder module 500 advantageously includes at least one gas distribution channel 210 connected to a thermal resistance gas management system 200 and capable of distributing a thermal resistance gas near the growth support 51.

The thermal resistance gas can, for example, be a mixture comprising argon, hydrogen, and/or helium. The use of a thermal resistance gas allows the temperature of the growth support 51 and the substrate to be finely controlled and thus to optimize diamond growth.

The area of the upper surface of the substrate holder, parallel to the growth support 51, is between 5% and 30% of the area of the cross section of the enclosure 400 at the growth support 51. For example, in a modular reactor according to the invention configured to operate with microwaves, the frequency of which is between 900 MHz and 1000 MHz, the area of the upper surface of the substrate holder, parallel to the growth support 51, is between 50 cm$^2$ and 300 cm$^2$, preferably between 50 cm$^2$ and 250 cm$^2$.

Prior art substrate holders often have a reduced volume and occupy only a limited space in the deposition reactor. The present inventors have developed a substrate holder module 500 that can include many functionalities and have a high volume. Thanks to this large volume, the substrate holder module 500 according to the invention can, when moved in vertical translation, generate a significant modification of the resonant cavity 41 and therefore of the plasma. This large volume also allows to accommodate the different characteristics of the substrate holder according to the invention (e.g. cooling by a fluid, by a thermal resistance gas, system of rotation, and the like). Thus, thanks to its volume and its ability to allow the vertical displacement of the growth support 51, such a substrate holder module 500 can be used to optimize the growth parameters. In a modular reactor according to the invention configured to operate with microwaves, the frequency of which is between 900 MHz and 1000 MHz, preferably the substrate holder module 500 has a volume between 1000 cm$^3$ and 10,000 cm$^3$.

Similarly, the substrate holder module 500 preferably has a diameter (or cross-sectional surface) that is constant and substantially identical to the diameter (or surface) of the growth support 51.

In addition, the substrate holder module 500 can possibly be electrically insulated from the resonant cavity 41, the enclosure 400 and/or the tray 900 according to the invention. This allows a different electrical potential between the substrate holder module 500 and the resonant cavity 41. More preferably, the substrate holder module 500 is electrically insulated from the other elements of the reactor 1. This characteristic may allow, during the implementation of the reactor according to the invention, the substrate holder module 500 to be moved in vertical translation without causing a significant change in the shape of the plasma. The substrate holder module 500 can, for example, be insulated via a PTFE drilled cylinder, a PTFE seal, or other electrical insulating materials placed between the substrate holder module 500 and the tray 900.

When the reactor comprises the substrate holder module 500 in combination with the tray 900, then the tray 900 can advantageously include means capable of clerically insulating 970 (e.g. PTFE seals or blocks or other electrical insulating materials) to ensure electrical insulation between the substrate holder and the tray 900. In addition, the base of the enclosure may include, at the opening for the passage of the substrate holder module 500, an insulated means 980 including art electrically insulating material (e.g. a seal) allowing the substrate holder module 500 to be insulated from the enclosure 400. Advantageously, the base of the enclosure includes at the opening allowing the passage of the substrate holder module 500, a seat system allowing the substrate holder module 500 to be electrically insulated from the enclosure.

Preferably, the means for ensuring electrical insulation is made of PTFE. In this embodiment, the one or more fluids passing through the substrate holder are not or only slightly conductive, it is possible to use, for example, deionized water or silicone oil. For example, the conductivity of the fluid is less than 50 µS/cm, preferably less than 20 µS/cm. This allows the tray 900 and/or the enclosure 400 to be electrically insulated from the substrate holder module 500 and thus to remove its influence on the characteristics of the plasma core.

As described above, the substrate holder module 500 may include a connection to a thermal resistance gas management system 200. In order to control the growth conditions, it is necessary to control the heat transfers in order to best control the temperature distribution at the growth support 51 and growth surface. An essential monitoring area for these heat transfers is the diamond growth area, at the substrate. However, depending on the shape or arrangement of the substrate, as well as the result to be achieved (e.g. thickness, growth rate, growth orientation) not the same cooling is expected at the growth support 51. Thus, in order to be able to finely control the cooling at the growth support 51, the inventors have developed another modular element consisting of a substrate cooling control module 300, comprising a removable thermal resistance gas injection device 330 that can be easily replaced between two growths and adapting to the expected growth. This substrate cooling control module 300 is shown in FIGS. 5A and 5B. This system can be advantageously adjusted in height during growth.

As shown in FIG. 5A, the substrate cooling control module 300 comprises a removable thermal resistance gas injection device 330. The substrate cooling control module 300 advantageously allows to maintain the growth surface at a temperature between 600° C. and 1400° C. and control the spatial distribution of the thermal gradient between the growth surface and the substrate holder. For ultra-nanocrystalline diamond layers, temperatures from 150° C. to 400° C. will be sought.

The removable thermal resistance gas injection device 330 according to the invention comprises one or more thermal resistance gas inputs 333 and one or more thermal resistance gas outputs 331. The thermal resistance, gas input 333 can be connected to the thermal resistance gas outputs 331 via a distribution chamber 332.

The thermal resistance gas input 333 is preferably located in the center of the removable thermal resistance gas injection device 330. The removable thermal resistance gas injection device 300 may comprise several thermal resistance gas inputs 333. The existence of several thermal resistance gas inputs 333 allows the use of oases or mixtures of gases of different thermal resistance to be managed. For example, one input is dedicated to a first thermal resistance gas while another input is dedicated to another thermal resistance gas. The thermal resistance gas inputs 333 can be connected to different distribution chambers 332. In addition, the presence of several thermal resistance gas inputs 333 allows different gases to be injected at independently adjustable concentrations or rates.

The thermal resistance gas input 333 can have, in a modular reactor according to the invention configured to operate with microwaves, the frequency of which is between 900 MHz and 1000 MHz, a diameter between 1 mm and 10 mm, for example. Preferably, the thermal resistance gas input 333 has a diameter between 3 mm and 7 mm.

The distribution chamber 332 of the removable thermal resistance gas injection device 300 allows to improve the homogeneity of the spatial distribution of the thermal resistance gases at the growth support 51. In a modular reactor according to the invention configured to operate with microwaves, the frequency of which is between 900 MHz and 1000 MHz, the volume of the distribution chamber 332 can preferably be between 0 mm$^3$ and 16000 mm$^3$. Preferably, the volume of the one or more distribution chambers 332 is reduced in order to increase the heat transfer between the substrate holder and the growth support 51. Thus, the height of the distribution chamber 332 is advantageously much reduced, for example it is between 0.02 mm and 5 mm, preferably between 0.05 mm and 1 mm. In addition, the distribution chamber 332 may not comprise a base as shown in FIG. 5A.

The removable thermal resistance gas injection device 300 may comprise several mixing chambers.

The one or more thermal resistance gas outputs 331 are arranged so that the thermal resistance gases are preferably injected underneath the growth support 51. They aim to manage the cooling of the growth support 51 and consequently to manage the temperature of the growth surface. Since these outputs are placed on the removable thermal resistance gas injection device 300, it is possible, thanks to the invention, to easily vary, between each growth, several factors essential for optimizing the growth conditions and related to the thermal resistance gas outputs, such as: their number, their orientation, and their density. The modulation of these parameters allows to provide cooling modulation characteristics of the growth support 51 adapted to the desired growth.

The distance between the thermal resistance gas outputs 331 and the growth support 51 can affect the growth of diamond layers. This distance can be the same over the entire growth support 51 and it can be reduced in the case where relatively low growth temperatures are desired. Thus, the substrate cooling control module 300 may advantageously comprise positioning means 320 that can be independent or integrated to the removable thermal resistance gas injection device 300.

The positioning means 320 according to the invention can take on different shapes, such as a hexahedron, for example, a cube or a parallelepiped, a prism, a cylinder.

In a modular reactor according to the invention configured to operate with microwaves, the frequency of which is between 900 MHz and 1000 MHz, it is advantageous that the positioning means 320 according to the invention have a height of less than 800 µm, more preferably less than 500 µm, and even more preferably less than 250 µm. The positioning means 320 generally have a height greater than 5 µm.

In addition, it is advantageous that, when several positioning means 320 are used according to the invention, these means have a variation in height of less than 10%, preferably less than 5%, even more preferably less than 2%. Indeed, in the context of the present invention, the presence of positioning means 320 with a very low height variation leads to a more optimum control of the temperature of the growing surface and therefore to a better controlled growth.

Alternatively, these positioning means 320 can advantageously have significant height differences allowing to modulate the cooling characteristics of the growth surfaces. It is nevertheless desirable that the growth support 51 be positioned parallel to the surface of the enclosure base 441.

These positioning means 320 can be removable and can be advantageously held to position with respect to the growth support 51 via recesses in the lower surface of the growth support 51, such as notches. Thus, the growth support 51 may include on its lower surface recesses adapted to accommodate positioning means 320. These recesses have a cross-section area preferably between 0.5 cm$^2$ and 5 cm$^2$, a depth of less than 1 cm, preferably less than 5 mm. Thus, the growth support 51 may comprise between 3 and 30 recesses, preferably between 3 and 15, and more preferably between 3 and 7 recesses. These recesses can have different cross-sectional shapes (e.g. circular, rectangular, square).

In addition, these positioning means 320 can be mobile in vertical translation and be associated with a vertical translation means allowing a slow and precise movement of these positioning means 320. The purpose of this vertical translation movement is to modulate the distance between the growth support 51 and the thermal resistance gas infection device 330 or the substrate holder module 500 or the substrate holder 50. The vertical translation means can, for example, be selected from means such as cylinders, bellows, or actuators. This vertical mobility allows the distance between the thermal resistance gas injection device 300 and the growth support to evolve during growth in order to add an additional level of control over the temperature of the one or more growth surfaces.

The positioning means 320 according to the invention may be made of a wide variety of materials, for example a metal, a dielectric material, or graphite or the like, of a high purity or as multilayers.

The removable thermal resistance gas injection device 300 can advantageously be reduced in height in order to increase heat transfer between the substrate holder cooling system and the growth support 51. Thus, preferably, the removable thermal resistance gas injection device 330 has a height of less than 1 mm, more preferably less than 100 µm. In addition, these heights can be adjusted depending on the thickness of the growth support 51.

Indeed, advantageously, the removable thermal resistance gas injection device 330 is configured so that the distance between the removable thermal resistance gas injection device 330 and the substrate holder 50 (or the substrate holder module 500) is less than 200 µm, preferably less than 50 µm, and even more preferably less than 10 µm. They can also be configured so that device 330 and the substrate holder 50 are in contact on a surface at least equal to the surface of the growth support 51.

As shown in FIG. 5B, the removable thermal resistance gas injection device 330 can integrate the growth support 51. This has the advantage of improving heat exchange and thus ensuring better cooling of the one or more substrates. This configuration allows, in particular, by eliminating some of the hollow spaces that may exist between the substrate holder 50 and the growth support 51, to optimize heat control of the upper surface of the growth support 51.

For example, the substrate coding control module 300 allows to implement a method wherein the thermal resistance gases are ejected from the cooling system towards the resonant cavity 41 at a total gas flow rate of at least 20 sccm, preferably at least 50 sccm.

The substrate cooling control module 300 according to the invention can be advantageously used in combination with the substrate holder module 500 according to the invention, but it can also be used with conventional substrate holders. Indeed, conventional substrate holders can comprise one or more thermal resistance gas outputs in which the substrate cooling control module 300 according to the invention could be adapted.

The removable thermal resistance gas injection device 300 gives users the ability to finely modulate the distribution of thermal resistance gases and adapt it to the desired growth conditions of the diamond layers. Indeed, when growing diamond, temperature management at the substrate must be adapted depending on the position of the one or more substrates in the resonant cavity 41, the gas composition used for growth, the pressure and power conditions, the number of growing diamond substrates (or the size of the polycrystalline diamond layer), the characteristics of the growing diamond layers (polycrystalline, single crystal), and the expected duration of the growth reaction. This device in this context is particularly useful when optimizing the growth conditions.

In addition, the thermal resistance gas outputs 331 have the advantage of a thermal resistance gas distribution in order to obtain an optimum substrate temperature distribution over the entire growth surface. Nevertheless, they have the disadvantage of getting dogged up. The existence of such a removable thermal resistance gas injection device 300 makes it possible to replace this part without having to replace a whole set of parts connected to such a cooling module.

The inventors have also optimized the distribution of the outputs within the removable thermal resistance gas injection device 300 in order to allow for an optimum gas distribution with respect to the growth of the one or more diamond single crystals, or a polycrystalline diamond layer. The advantage of using a removable thermal resistance gas injection device 300 is that it is possible to vary several parameters such as the output dimensions or output density.

As shown in FIG. 6A, the thermal resistance gas outputs 331 can have different shapes. For example, the cross-section of the outputs 331 can have a circular, square, rectangular, diamond shape. The shape of this section can vary between two outputs 331, but also within a same output 331 depending on whether the section of the output 331 on the inner surface 336 or on the outer surface 335 of the removable thermal resistance gas injection device 330 is considered. Preferably, the section of the outputs 331 has a circular shape.

As shown in FIG. 6B, the thermal resistance gas outputs 331 can have different cross-sectional surfaces. For example, the total cross-section of the outputs 331 may have an area between 5% and 15% of the area of the growth support 51. The surface of this cross-section may vary between two outputs 331, but also within a same output 331 depending on whether the cross-section of the output 331 on the inner surface 336 or on the outer surface 335 of the removable thermal resistance gas injection device 330 is considered.

In a modular reactor according to the invention configured to operate with microwaves, the frequency of which is between 900 MHz and 1000 MHz, each thermal resistance gas output 331 may have a diameter, on the inner surface 336 of the removable thermal resistance gas injection device 330, between 0.2 mm and 5 mm, preferably between 0.5 mm and 3 mm.

In a modular reactor according to the invention configured to operate with microwaves, the frequency of which is between 900 MHz and 1000 MHz, each thermal resistance gas output 331 may have a diameter, on the outer surface 335 of the removable thermal resistance gas injection device 300, between 0.5 mm and 3 mm.

The diameters of the thermal resistance gas outputs 331, either on the inner surface 336 or outer surface 335 of the thermal resistance gas injection device 330 can be configured so as to obtain an optimum distribution of the one or more thermal resistance gases over the entire surface equivalent to the growth support 51.

In addition, within a same removable thermal resistance gas injection device 330, the diameters of the thermal resistance gas outputs 331, either on the inner surface 336 or outer surface 335 of the removable thermal resistance gas injection device 330, may be equal, but they may also vary according to the position of the output within the removable thermal resistance gas injection device 330 with respect to the axis of symmetry of the reactor.

The removable thermal resistance gas injection device 300 according to the invention allows the output density to be easily varied and provides a modular network of thermal resistance gas outputs 331.

Thus, for example, the removable thermal resistance gas injection device 330 comprises a thermal resistance gas output density 331 of at least 1 output/cm$^2$. The density of the thermal resistance gas outputs 331 is measured by dividing the number of outputs present on the removable thermal resistance gas injection device 330 by the surface of the injection device facing the growth support 51. The removable thermal resistance gas injection device 300 can comprise an output density well above 1 output/cm$^2$. Indeed, a high-output density allows to optimize the flow of thermal resistance gas during use and thus allows the temperature of the one or more substrates to be modulated in order to obtain the uniform formation in thickness of a homogeneous diamond film at high speeds over a relatively large surface. Thus, in a modular reactor according to the invention configured to operate with microwaves, the frequency of which is preferably between 900 MHz and 1000 MHz, the removable thermal resistance gas injection device 330 comprises thermal resistance gas outputs 331 at an average density between 0.1 and 5 outputs per cm$^2$, more preferably a density between 0.1 and 3 outputs per cm$^2$, even more preferably a density between 0.2 and 2 outputs per cm$^2$. In addition to this possible modularity of density of thermal resistance gas outputs 331 allowing the distribution of thermal resistance gas to be modulated between each experiment, the use of several thermal resistance gas inputs 333 and/or distribution chambers 332, allows the distribution of thermal resistance gas to be modulated during the experiment.

With such a density of thermal resistance gas outputs 331, the removable thermal resistance gas injection device 330 can comprise at least 5, for example at least 10, preferably at least 20, preferably at least 50 outputs.

The upper outer surface of the removable thermal resistance gas injection device 330, that is to say the surface closest to the growth support 51, can take on several shapes such as a circle, a square, a rectangle, an ellipse, a portion of a circle. Preferably, the shape of the upper outer surface of the removable thermal resistance gas injection device 330 is substantially identical to the shape of the growth support 51.

As with the output diameter, the density of the outputs within a same removable thermal resistance gas injection device 300 may vary depending on the location within the injection device 330.

Another of the modulation elements proposed by the inventors is a crown 450 adapted to be positioned between a first enclosure part 430 and a second enclosure part 440 in order to change the shape and/or volume of the resonant cavity 41. In addition, the one or more crowns 450 according to the invention may have many additional functions such as modifying the point shape of the resonant cavity 41, gas injections, windows for growth observation, temperature measurement and/or substrate analysis e.g. height, color). A crown 450 is shown in FIG. 7. The modular reactor 1 according to the invention may comprise one or more crowns 450 and preferably one or two crowns 450. As shown in FIG. 7, these crowns 450 can be positioned at different heights of the enclosure 400 and preferably at the resonant cavity 41, In addition, a crown 450 according to the invention may allow the injection of growth and/or thermal resistance gases.

As shown in FIG. 7, the crown 450 allows the geometry of the resonant cavity 41 to be varied and, for example, the height between the waveguide 82 and the base 441 of the enclosure 400 to be increased. This modular element can optimize the spatial distributions of gas temperature and atomic H density in the plasma in order to optimize them at the plasma/surface interface. This modularity is preferably coupled with the modularity provided by the tray 900 in order to give the user large dimensional latitude in order to adapt the configuration of the resonant cavity 41 to the desired growth. For this application, preferably, the crown 450 is a metallic crown. It may, for example, comprise or consist of aluminum or an aluminum alloy.

The first enclosure part can comprise, for example, the gas inlet system and the wave coupling module. The second enclosure part may include, for example, the gas output module and the growth support. When the modular reactor 1 according to the invention includes two crowns, then preferably one crown 450 is adapted to be positioned between a first enclosure part 430 and a third enclosure part 470 and one crown 450 is adapted to be positioned between a second enclosure part 440 and a third enclosure part 470.

Alternatively, the crown 450 may comprise or consist of a dielectric material such as quartz. Indeed, the crown 450 comprising or consisting of quartz allows to observe the growth and successive deposits of the diamond layers. Thus, advantageously, the crown 450 comprises a dielectric material, for example in the form of a dielectric observation window (e.g. portholes). The crown 450 can also consist of 20% to 80% dielectric material. The dielectric material can take on the shape of an annular window, or be integrated into the crown 450 in the form a flat window that can take on different shapes (e.g. rectangle, square, circle).

The crown 450 can comprise a gas injection means, preferably a radial one. This injection means can allow the injection of gases such as argon or the injection of doping gases or methane near the growth support 51.

The first enclosure part 430 preferably encompasses the gas inlet system 10 and the wave coupling module 80. The second enclosure part 440 preferably encompasses the gas output module 60 and the growth support 51.

The sea system 460 is arranged between the crown 450 and the first enclosure part 430 and the second enclosure part 440, respectively. The seal system 460 allows for the vacuum tightness and ensures the electrical continuity of the enclosure walls. The seal system 460 can comprise several seals that can consist of similar or different materials and, for example, comprise materials selected from copper, beryllium, a copper-beryllium combination, or a paste containing metal particles such as sliver, for example. Preferably, the seat system 460 includes beryllium, and preferably a copper-beryllium mixture. This seal can take on different shapes, such as a metallic braid, or a paste containing metal particles, such as silver particles, for example. The seal system 460 can also comprise a fluoropolymer such as Viton in order to ensure vacuum tightness. The seal system 460 ensuring the electrical conductivity of the enclosure walls and tightness of the resonant cavity 41 can rest on a first seal or set of seals used to associate the first enclosure part 430 and the second enclosure part 440, as well as a second seal or set of seals associated with the crown 450.

The crown 450 can have a wide range of thickness and height. Preferably, in a modular reactor according to the invention configured to operate with microwaves, the frequency of which is between 900 MHz and 1000 MHz, the crown 450 has a height between 1 cm and 20 cm, more preferably, the crown 450 has a height between 1 cm and 10 cm, even more preferably the crown 450 has a height between 3 cm and 10 cm.

Preferably, the crown 450 is adapted to be positioned between the coupler 80 and the base 441 of the enclosure or the tray 900. Since the crown 450 is intended to be inserted between a first enclosure part 430 and a second enclosure part 440, it can take on substantially the shape of the inner and outer walls of the enclosure 400. This crown 450 can take on the shape of a ring if the enclosure 400 is cylindrical.

Preferably, in a modular reactor according to the invention configured to operate with microwaves, the frequency of which is between 900 MHz and 1000 MHz, the crown 450 has a thickness between 1 cm and 10 cm. More preferably, the crown 450 has a thickness between 3 cm and 10 cm, According to one embodiment, the crown 450 has a thickness constant over its entire height and is, for example, similar to the thickness of the walls of the enclosure 400. Alternatively, the crown 450 can have a thickness varying over its height and in particular a thickness greater than the thickness of the walls of the enclosure. Thus, in this condition, the crown 450 is able to induce a deformation of the resonant cavity 41 as shown in FIG. 7. When the crown 450 is used to induce a deformation of the resonant cavity 41, it is preferably placed near the growth support 51.

Preferably, the crown 450 is adapted to be positioned between two enclosure parts with substantially identical, and more preferably identical, cross-sectional shapes. Alternatively, the crown 450 is adapted to be positioned between two enclosure parts with different cross-sectional shapes, and it then allows a junction to be made between these two enclosure parts with different shapes.

In addition to the possibility, thanks to this modular element, to vary the dimensions of the resonant cavity 41 and therefore the growth parameters, this crown 450 can be connected to a cooling system 600 configured to cool it independently from the first enclosure part 430 and the second enclosure part 440. Thus, the crown 450 can be placed at the plasma formation height and benefit from a cooling stronger than the other parts of the enclosure. This modular element then allows to adapt cooling to the actual needs of the reactor 1.

Thus, preferably, the crown 450 is connected to a cooling system configured to cool it independently from the first enclosure part 430 and/or the second enclosure part 440. More preferably, the cooling system 600 is configured to induce a greater temperature decrease on the crown 450 than on the first part 430 and/or the second part 440 of the enclosure 400. The cooling system 600 can also be configured to independently cool the coupling module 80.

The crown 450 can combine several functions simultaneously, such as raising the cavity, injecting gases, and providing a metallic bulge in an appropriate part of the resonant cavity 41 or, on the contrary, an outward deformation.

FIG. 8 shows a microwave plasma reactor similar to the one shown in FIG. 1. The arrangement shown in FIG. 8 differs in that it comprises a substrate holder module 500 and the gas inlet system 10 comprises a gas distribution module 100.

This gas distribution module 100 includes a removable gas distribution plate 110 comprising an inner surface 111, an outer surface 112, and a plurality of gas distribution nozzles 113 forming channels between said surfaces 111, 112 capable of conducting a gas flow towards a growth support 51. This gas distribution module 100 is a modular element according to the invention, it therefore allows to vary easily and between each growth several factors essential to the optimization of the growth conditions:

the number of gas input nozzles.
the orientation of the nozzles, and
the density of the nozzles.

The modulation of these parameters allows to provide good gas flow characteristics creating a laminar flow of the gas flow. As shown in FIG. 8, the inner face 111 of the removable gas distribution plate 110 corresponds to the face facing the resonant cavity 41 and partially forming the latter.

In addition, this gas distribution module 100 comprises a support device 120 adapted to accommodate the removable gas distribution plate 110. This support device 120 is connected to a cooling system, preferably a fluid cooling system. This coupling allows a thermal bridge to be established making it possible to cool the removable gas distribution plate 110. The removable gas distribution plate 110 can be placed on a support device 120, but it can also be positioned so that the support device 120 is above the removable gas distribution plate 110, or so that the support device 120 surrounds the removable gas distribution plate 110.

This gas distribution module 100 gives users the possibility to finely modulate the gas distribution and adapt it to the growth conditions of the desired diamond layers. Indeed, during diamond growth, the distribution of the gas in the resonant cavity 41 must be adapted depending on the position of the one or more substrates, the number of substrates, the shape of the one or more substrates, and the anticipated duration of the reaction. This module in this context is particularly useful when optimizing the growth conditions. For example, the implementation of a deposition reactor comprising the gas distribution module 100 according to the invention in a diamond growth method may allow the synthesis of a large single crystal diamond with a substantially uniform dopant concentration or the growth of a larger number of diamond single crystals grown in a single pass on experiment) or a polycrystalline diamond layer. The gas distribution module 100 is preferably maintained at the central part of the cooled waveguide system.

In addition, conventional gas distribution nozzles have the advantage of an almost homogeneous gas distribution, but have the disadvantage of getting clogged up. The existence of such a distribution module makes it possible to replace the removable gas distribution plate 110 without having to replace a whole set of parts connected to such a module.

The inventors have also optimized the distribution of the nozzles within the removable module in order to allow for an optimum gas distribution modular with respect to the growth of the one or more single crystal diamond substrates or a polycrystalline diamond wafer.

This removable gas distribution plate 110 is preferably positioned substantially parallel to the growth support 51.

The advantage of using a removable gas distribution plate 110 is that many parameters such as the diameter of the nozzles, the density of the nozzles, the orientation of the nozzles, and/or, during growth, the injected gases, can be varied.

In a modular reactor according to the invention configured to operate with microwaves, the frequency of which is between 900 MHz and 1000 MHz, the diameter of the gas distribution nozzles 113, on the inner surface 111 of the removable gas distribution plate 110, can be between 0.1 mm and 3 mm. Preferably, the gas distribution nozzles 113 may have a diameter, on the inner surface 111 of the removable gas distribution plate 110, between 0.2 mm and 2 mm.

In addition, within a same gas distribution module 100, the diameter of the nozzles may be homogeneous, but it may also vary depending on the position of the nozzle within the removable gas distribution plate 110 with respect to the axis of symmetry of the reactor.

In a modular reactor according to the invention configured to operate with microwaves, the frequency of which is between 900 MHz and 1000 MHz, preferably, the surface available for placing nozzles is from 500 to 650 cm$^2$. The sum of the surfaces, on the inner surface 111 of the removable gas distribution plate 110, of the gas distribution nozzles 113 may represent a percentage of the inner surface between 1% and 20%. With each of the gas distribution nozzles 113 representing a surface between $10^{-2}$ mm$^2$ and 30 mm$^2$.

Alternatively, the surface occupied by the gas distribution nozzles 113 located in a central part 114 of the removable gas distribution plate 110 represents a percentage of the inner surface 111 of the removable gas distribution plate 110 between 20% and 50% while the surface occupied by the gas distribution nozzles 113 located in a peripheral part 115 of the removable gas distribution plate 110 represent a percentage of the inner area 111 of the removable gas distribution plate 110 between 50% and 20%.

Small nozzles are advantageous for providing gas flows at high directed speeds. However, such nozzles can clog up more easily causing a disturbance in the gas flow rate and therefore a disturbance in the uniform deposition of a diamond film over a relatively large surface. Here, since the removable gas distribution plate is removable, it can include small diameter nozzles and in case of clogging up this plate can be replaced quickly and at a lower cost. Thus, in particular, the removable gas distribution plate 110 may comprise gas distribution nozzles 113 with a diameter of less than 8 mm, preferably less than 5.5 mm, more preferably less than 3 mm. In addition, the removable gas distribution plate 110 according to the invention can consist of a porous plate, such as a porous ceramic.

Unlike conventional gas distribution systems, the gas distribution module according to the invention allows the nozzle density to be easily varied and provides a modular network of gas distribution nozzles 113.

Thus, for example, the removable gas distribution plate 110 comprises a density of gas distribution nozzle 113 of at least 0.1 nozzles/cm$^2$.

The density of the gas distribution nozzles 113 is measured by dividing the number of nozzles present on the gas distribution plate 110 by the surface expressed in cm$^2$ of the removable gas distribution plate 110 facing the resonant cavity 41. The network can comprise a density of gas input nozzles well above 0.1 nozzles/cm$^2$. Indeed, it has been found that providing a relatively high density of nozzles allows a uniform diamond film to be formed over a relatively large surface. Thus, in a modular reactor according to the invention configured to operate with microwaves, the frequency of which is between 900 MHz and 1000 MHz, preferably, the removable gas distribution pate 110 comprises gas distribution nozzles 113 with a density between 0.2 and 4 nozzles per cm².

With such a density of gas distribution nozzles 113, the removable gas distribution plate 110 can comprise at least 10 nozzles, for example at least 30 nozzles, preferably at least 50 nozzles, preferably at least 100 nozzles, more preferably at least 200 nozzles, and even more preferably at least 500 gas distribution nozzles 113. In particular, the central part 114 may comprise a higher density of gas distribution nozzles 113.

The central part 114 can take on several shapes such as a circle, a square, a rectangle, or an ellipse. Preferably, the shape of the central part 114 is substantially identical to the shape of the growth support 51.

As with the diameter of the nozzles, the density of the nozzles within a same removable gas distribution plate 110 may vary. For example, the spacing between the nozzles can increase with the radius, so that the density of the nozzles decreases towards the outer edge of the die. It is possible to have a random network of nozzles providing a reasonably uniform average nozzle density to achieve appropriate performance and accomplish some of the advantages of this invention.

The orientations of the gas distribution nozzles 113 may be the same for all nozzles within the removable gas distribution plate 110 or they may also vary within a same plate. The orientations of the gas distribution nozzles 113 are preferably substantially parallel to the central axis of the resonant cavity 41. The gas distribution nozzles 113 can be oriented so that the gas flow forms a substantially orthogonal angle with the growth support 51.

The gas distribution nozzles 113 can be oriented so that the gas flow forms an angle with the growth support 51 between 60° and 120°.

The orientations of the gas distribution nozzles 113 can be varied depending on their position within the removable gas distribution plate 110. They can be oriented inwards or outwards. It may be advantageous to direct some of the gas distribution nozzles 113 inwards in a converging configuration in order to form a more uniform diamond film or when a non-planar substrate is used. Indeed, the particular orientation of the nozzles may allow to change the spatial distribution of certain species in the plasma, which may be advantageous for growth on a non-planar substrate. This also applies for a divergent orientation.

Thus, in particular, the gas distribution nozzles 113 located m a central part 114 of the removable gas distribution plate 110 are oriented so that the gas flow forms an angle with the growth support 51 between 80° and 100° white the gas distribution nozzles 113 located in a peripheral part 115 of the removable gas distribution plate 110 are oriented so that the gas flow forms an angle with the growth support 51 between 60° and 80° or 100° and 120°.

The central part 114 of the removable gas distribution plate 110 corresponds to a surface that can be defined by a circle, the center of which is positioned at the center of the removable gas distribution plate 110 and the diameter of which is substantially equal to half the diameter of the removable gas distribution plate 110.

The inventors determined an optimum distribution of the nozzle diameters 113 depending on the position i of the nozzle on the radius of the removable gas distribution plate 110 with respect to the axis of symmetry of the reactor.

This distribution satisfies the equation:

$$\Phi_i = \Phi_0 + y^* i$$

with:
- $\Phi_i$ being the diameter of the nozzle numbered i.
- $\Phi_0$ being the diameter of the central nozzle.
- i being the number of the nozzle on a radius of the removable gas distribution plate, the numbering starting from the center of the removable gas distribution plate 110 towards its ends, i varying between 0 and 60, for a modular reactor 1 configured to operate between 900 and 1000 MHz,
- y varying from 0.05 to 0.3, for a modular reactor 1 configured to operate between 900 and 1000 MHz.

This distribution allows to obtain better performance than a network including nozzles with a same or random diameter.

During certain growths, at least three different gases can be injected into the resonant cavity 41. The distribution of these gases as they enter the resonant cavity 41 is important for a homogeneous and rapid growth. Thus, advantageously, the removable gas distribution plate 110 comprises a chamber 117 forming a dispersion chamber capable of promoting mixing and allows the control of the gas distribution. The chamber 117 can function as a mixing chamber for mixing the source gases before injection into the plasma chamber. Such mixing before the injection into the plasma chamber allows to improve the efficiency of the mixture gas. In addition, this chamber 117 allows to improve the uniform gas flow over the entire gas nozzle network, especially at low gas flow rates.

In particular, the diameter of a gas distribution nozzle 113 on the inner face is not the same as the diameter of the same nozzle on its outer face of the removable gas distribution plate 110. This has the advantage of easily changing the gas flow characteristics.

The gas distribution module 100 is connected to gas cylinders positioned outside the reactor. Part of the gas distribution module 100 is preferably located above the resonant cavity 41 and near the wave coupling module 80. By "near", should be understood that the gas distribution module 100 comprises gas distribution nozzles 113 for the injection of gases into the resonant cavity 41 located less than 15 cm, preferably less than 10 cm, more preferably less than 5 cm, from the dielectric window 82.

The gas distribution module 100 allows to implement a method where the gases are injected towards the growth support 51 at a total gas flow rate of at least 500 cm³ per minute. The gas distribution module can also allow the injection of dopant into the resonant cavity 41. Thus, the gas distribution module 100 can allow to implement a method where the gases comprise at least one dopant at a concentration equal to or greater than 0.01 ppm.

In a modular reactor according to the invention configured to operate with microwaves, the frequency of which is between 900 MHz and 1000 MHz, the flow rate of the gas injected into the resonant cavity 41 by the gas inlet system 10 can be at least 500 cm³ per minute, preferably at least 1000 cm³ per minute, more preferably at east 5000 cm³ per minute.

The gas distribution module is preferably dose to a cooling system such as that of the central part of the waveguide.

In addition, as shown in FIG. 9, the support device 120 can comprise at least one channel 121 capable of circulating a fluid (e.g. a gas or liquid) in said support device 120. This allows a thermal drain cooling of the removable gas distribution plate 110. The support device 120 can also comprise a contact surface 122 adapted to accommodate the removable gas distribution plate 110.

The support device 120 can contain one or more channels 121. For example, the support device 120 comprises a cross channel positioned at the location intended to accommodate the removable gas distribution plate 110. The support device 120 can comprise several channels 121 allowing, at the same flow rate, a more homogeneous cooling.

The one or more channels 121 are preferably arranged near the contact surface 122. By "near", should be understood, within the meaning of the invention, less than 5 cm apart, preferably less than 3 cm apart, more preferably less than 1 cm apart.

The contact surface 122 of the support device 120 preferably has a surface greater than or equal to 10% of the surface of the support device 120 in order to allow for a sufficient heat transfer. In a modular reactor according to the invention configured to operate with microwaves, the frequency of which is between 900 MHz and 1000 MHz, the contact surface 122 of the support device 120 preferably has a surface greater than 50 cm$^2$ in order to allow for a sufficient heat transfer. The contact surface 122 of the support device 120 has a surface, more preferably, greater than 60 cm$^2$, and even more preferably, greater than 70 cm$^2$.

Advantageously, the removable gas distribution plate 110 includes at least one end part 116 that does not comprise gas distribution nozzles 113 and this end part 116 is adapted to be in contact with the support device 120 over a surface greater than 50 cm$^2$ in order to improve heat transfer. Preferably, the end part 116 that does not comprise gas distribution nozzles 113 is adapted to be in contact with the support device 120 on a surface greater than 60 cm$^2$, and even more preferably on a surface greater than 70 cm$^2$.

As shown in FIG. 10A, the end part 116 may consist of the perimeter of the removable gas distribution plate 110. Alternatively and as shown in FIG. 10B, the end part 116 can take on different shapes in order to improve heat transfer.

As shown in FIG. 11, advantageously, the gas distribution module 100 includes a thermal drain member 130 positioned above the removable gas distribution plate 110 and the support device 120. The thermal drain member 130 may have a heat acquisition surface 131 in contact with the removable gas distribution plate 110 representing more than 10%, preferably more than 20% of the surface of the removable gas distribution plate 110, and a heat distribution surface 132 in contact with the support device 120 representing more than 10%, preferably more than 20% of the surface of the device 120. In a modular reactor according to the invention configured to operate with microwaves, the frequency of which is between 900 MHz and 1000 MHz, the thermal drain member 130 can have a heat acquisition surface 131 in contact with the removable gas distribution plate 110 greater than 20 cm$^2$, preferably greater than 40 cm$^2$, even more preferably greater than 60 cm$^2$, and a heat distribution surface 132 in contact with the support device 120 greater than 10 cm$^2$, preferably greater than 20 cm$^2$, even more preferably greater than 50 cm$^2$.

In addition, the gas distribution module 100 may include a holding member 140 configured to attach the removable gas distribution plate 110 to the support device 120. This holding member 140 can comprise, for example, a spring, a clip mechanism, a hook, a slide, a notch, a tab, screws, or a lug. Preferably, this holding member 140 can be configured in order to compensate for the expansion differences between the support device 120 and the removable system. Preferably, this holding member 140 has elasticity properties and is configured to be placed at the interface between the support device 120 and the removable gas distribution plate 110.

The removable gas distribution plate 110 is preferably made of aluminum, an aluminum or copper alloy, more preferably the removable gas distribution plate 110 is made of copper.

The support device 120 is preferably made of aluminum, an aluminum or copper alloy, more preferably the support device 120 is made of copper.

The thermal drain member 130 is preferably made of aluminum, an aluminum or copper alloy, more preferably the thermal drain member 130 is made of copper.

According to another aspect, the invention relates to a method for synthesizing diamond implementing the modular reactor according to the invention.

The synthesis method 800 according to the invention preferably implements the modular reactor 1 according to the invention. It is shown in FIG. 12. The synthesis method 800 includes a step 810 of placing the one or more substrates on the growth support 51 of the modular reactor 1 according to the invention. For example, it is possible to use a silicon plate, a metal plate (Mo, W, and the like, . . . ), a polycrystalline diamond plate, diamond single crystals (natural, from a high pressure-high temperature (HPHT) method, from a CVD (chemical vapor deposition) method using the modular reactor of the invention or not, or single crystals from other materials (metals or the like . . . ). The diamond synthesis is preferably carried out on a single crystal diamond substrate. Thus, the diamond synthesis method according to the invention preferably includes a homoepitaxial growth. The single crystal substrate can have different shapes and dimensions. For example, it may have the shape of a cylinder, a cube, a parallelepiped, or the like. The dimensions may vary, for example, from 100 micrometers to several millimeters in height and several millimeters, even centimeters, in diameter or on the sides.

The synthesis method 800 according to the invention may include a step 801 of preparing the substrate. The objective of this step is, for example, to reduce the number of dislocations at the surface of single crystals. One embodiment for this step is described, for example, in patent FR3022563. A step 801 of preparing the one or more substrates can be performed before, but also after, the one or more substrates are placed in the reactor 1.

The synthesis method 800 according to the invention includes a step 820 of operating the modular reactor 1. The objective of this step is:
- to generate a pressure between 0.2 hPa and 500 hPa within the resonant cavity 41,
- to inject microwaves, preferably in transmission mode $TM_{011}$, and at a power between 1 kW and 100 kW (or more), depending on the type of generator used (frequency used),
- to inject gases, for example at a total flow rate of at least 500 cm$^3$ per minute, the gases comprising, for example, methane and dihydrogen, and additives such as oxygen, nitrogen, boron, phosphorus, and argon, and
- to operate the cooling systems of the enclosure with its thermal resistance gas system, as well as a substrate cooling control system to control the temperature of the one or more growth surfaces, the gas injection system, and the substrate holder.

For a 915 MHz reactor, this allows, for example, to deliver on the substrate growth surface a surface power density of at least 0.5 W/mm$^2$, preferably at least 2 W/mm$^2$, and even more preferably at least 3 W/mm$^2$ of the substrate growth surface. Generally the power density is less than 5 W/mm² at the substrate growth surface. This step allows to generate a plasma above the substrate growth surface and allows to initiate crystal growth. In addition, the substrate temperature is maintained thanks to the cooling systems at a temperature between 700° C. and 1400° C. for example, except in the case of a nano or ultra-nanocrystalline diamond growth. A description of the different growth conditions can be found in reference works (Derjaguin B. V., Journal of Crystal growth 31 (1975) 44-48: C. Wild et al, Diamond and Related Materials, 2 (1993) 158-168; Gicquel A et al. Current Applied Physics, volt Issue 6, (2001) 479: Achard J et al, Journal of Crystal Growth 284 (2005) 396-405; Butler et al, J of physics-condensed Matter. vol 21, Issue 36 (2009); Silva et al, Phys. stat. sol (a) 203, No. 12, (2006) 3049-3055; Widman C. J. et al Diamond & Related Materials 64 (2016) 1-7). The surface power density can also be varied abruptly, for example by a pressure variation, to ensure abrupt variations in the composition or temperature of the one or more substrates, for example.

For polycrystalline diamond growth, the synthesis method 800 according to the invention may include a step 830 of coalescing the crystals. This step follows the diamond nucleation step at the surface of the substrate (creation of stable seeds at the surface of a non-diamond material). During this step, when the modular reactor 1 includes a tray 900 and/or a substrate holder module 500, the method may comprise a sub-step 831 of modifying the height of the surface 910 of the tray 900 and/or a sub-step 832 of the growth support 51. These height modifications, made possible by the modularity of the reactor according to the invention, allow to optimize the seeding, coalescence and growth parameters, namely the substrate temperature and/or surface power density at the substrate growth surface and/or the reinforced or reduced dopant incorporation. For example, in this step, the growth support 51 is positioned above the surface 910 of the tray 900.

This procedure can also be used for single crystal diamond growth.

The synthesis method 800 according to the invention includes a step 840 of growing (thickening/expanding) the diamond film. For polycrystalline films, this step occurs after the coalescence of the crystals and the formation of a crystalline film. Its objective is to thicken the crystalline film and improve its crystalline quality. During this step, when the modular reactor 1 includes a tray 900 and/or a substrate holder module 500, the method may comprise a sub-step 841 of modifying the height of the surface 910 of the tray 900 and/or 842 of the growth support 51. According to the invention, thanks to the modularity of the reactor, a sub-step of abruptly changing the substrate temperature and/or the composition of the reactive gases, just as pressure and power variables, can also be applied. The changes in height and/or growth conditions allow to optimize the growth parameters, namely the substrate temperature and/or power density at the substrate growth surface and/or the multilayer incorporation of dopants. For example, during a sub-step 843, the growth support 51 could be positioned even below the surface 910 of the tray 900. This last example could be used, by a judicious choice of the other operating conditions, to "pre-detach" the polycrystalline film from the non-diamond surface on which the film originated. An additional step 844 of resuming growth could then be carried out again (with the growth support 51 above the surface 910 of the tray 900 to further thicken the layer by ensuring a good control of the growth conditions.

This is an example implementing the modularity of the invention. The different modularities of the reactor can also be used for thickening diamond single crystals.

In addition, when the modular reactor 1 according to the invention includes a gas distribution module 100, the diamond synthesis method 800 may comprise a preliminary step of selecting and positioning a removable gas distribution plate 110 depending on the characteristics of the desired diamond layers. In addition, during growth, the gas flow and composition may vary.

When the modular reactor 1 according to the invention includes a crown 450, the diamond synthesis method 800 may comprise a preliminary step of selecting the dimensions of the crown 450 depending on the characteristics of the desired diamond layers and positioning the crown 450 between a first enclosure part 430 and a second enclosure part 440 in order to modify the shape and/or volume of the resonant cavity 41.

When the modular reactor 1 according to the invention includes a substrate cooling control module 300, the diamond synthesis method 800 may comprise a preliminary step of selecting and positioning a removable thermal resistance gas injection device 330 depending on the characteristics of the desired diamond layers.

Implementing the method according to the invention allows to obtain diamond layers that meet the desired industrial applications in a logic of optimizing costs and reducing time. For example, it can allow to manufacture high-quality diamond layers under growth conditions that are optimized in terms of time and cost. Thus, according to another aspect, the invention relates to diamond layers obtained from implementing the modular reactors 1 according to the invention, and more particularly from the method 800 according to the invention.

According to another aspect, the invention relates to some of the modules that can be integrated into the modular reactor 1 according to the invention.

Thus, the invention relates to a substrate holder module 500, mobile in vertical translation and in rotation, in contact with a quarter-wave 501 and including at least one fluid coding system 520. This substrate holder module 500 can have all the optional and/or advantageous characteristics described above as part of the modular reactor 1. These optional characteristics include, for example, an electrical insulation system for the substrate holder (e.g. an element in PTFE or another electrical insulator).

The invention also related to a tray 900 mobile in vertical translation in order to change the shape and volume of a resonant cavity 41 and including through openings 911 allowing the gases to pass. This tray 900 can have all the optional and/or advantageous characteristics described above as part of the modular reactor 1.

The invention also relates to a crown 450 adapted to be positioned between a first enclosure part 430 and a second enclosure part 440 in order to change the shape and/or volume of the resonant cavity 41. This crown 450 can have all the optional and/or advantageous characteristics described above in the context of the modular reactor 1. In addition, this crown 450 can comprise a seal system 460.

The invention also relates to a gas distribution module 100, including a removable gas distribution plate 110 comprising an inner surface 111, an outer surface 112, and a plurality of gas distribution nozzles 113 forming channels between said surfaces 111, 112 capable of conducting a gas flow, and a support device 120 connected to a cooling system and adapted to accommodate the removable gas distribution plate 110. This gas distribution module 100 can have all the optional and/or advantageous characteristics described above in the context of the modular reactor 1.

The invention also relates to a removable gas distribution plate 110 comprising an inner surface 111, an outer surface 112, and a plurality of des distribution nozzles 113 forming channels between said surfaces 111, 112 capable of conducting a gas flow. This removable gas distribution plate 110 can have all the optional and/or advantageous characteristics described above in the context of the modular reactor 1.

The invention also relates to a substrate cooling control module 300, including a removable thermal resistance gas injection device 330, said removable thermal resistance gas injection device 330 comprises one or more thermal resistance gas inputs 333 and one or more thermal resistance gas outputs 331. This substrate cooling control module 300 can have all the optional and/or advantageous characteristics described above in the context of the modular reactor 1.

The invention claimed is:

1. A microwave plasma-assisted modular deposition reactor for manufacturing synthetic diamond, the reactor comprising:
   a microwave generator configured to generate microwaves, the frequency of which is between 300 MHz and 3000 MHz,
   a resonant cavity formed, at least in part, by cylindrical inner walls of a reactor enclosure,
   a wave coupling module adapted to transfer the microwaves from the microwave generator to the resonant cavity in order to allow the formation of a plasma,
   a growth support present in the resonant cavity,
   a substrate holder module, mobile in vertical translation and in rotation, in contact with a quarter-wave and including at least one fluid cooling system,
   a first crown adapted to be positioned between a first enclosure part and a second enclosure part in order to change a shape and/or volume of the resonant cavity, and a first seal system, allowing for vacuum tightness and electrical continuity of the walls of the reactor enclosure, being arranged between the first crown and the first enclosure part and the second enclosure part, respectively,
   a second crown adapted to be positioned between the second enclosure part and a third enclosure part in order to change a shape and/or volume of the resonant cavity, and a second seal system, allowing for the vacuum tightness and electrical continuity of the walls of the reactor enclosure, being arranged between the second crown and the second enclosure part and the third enclosure part, respectively,
   the first crown or the second crown comprising a dielectric observation window, and
   at least one modulation element, the at least one modulation element being selected from:
      a tray mobile in vertical translation in order to change the shape and volume of the resonant cavity and including through openings allowing the gases to pass;
      a gas distribution module, including:
         a removable gas distribution plate comprising an inner surface, an outer surface and a plurality of gas distribution nozzles forming channels between the surfaces adapted to conduct a gas flow, and
         a support device connected to a cooling system and adapted to accommodate the removable gas distribution plate; and
      a substrate cooling control module, including a removable thermal resistance gas injection device, the removable thermal resistance gas injection device comprising one or more thermal resistance gas inputs and one or more thermal resistance gas outputs.

2. The reactor according to claim 1, comprising at least an additional modulation element, the additional modulation element being selected from:
   the tray;
   the gas distribution module; and
   the substrate cooling control module.

3. The reactor according to claim 1, the crowns having a height between 1 cm and 20 cm.

4. The reactor according to claim 1, at least one of the crowns either (i) including a dielectric material, including a gas injection system, or (ii) comprising metal with an inner diameter smaller than an inner diameter of the resonant cavity.

5. The reactor according to claim 1, wherein the substrate holder module is electrically insulated from the reactor enclosure and/or the tray.

6. The reactor according to claim 1, comprising the tray.

7. The reactor according to claim 6, wherein the tray includes at least one cooling channel connected to a cooling system and adapted to cool the tray.

8. The reactor according to claim 1, comprising the gas distribution module.

9. The reactor according to claim 8, wherein the support device comprises channels adapted to circulate a gas or liquid in the support device.

10. The reactor according to claim 8, wherein the removable gas distribution plate includes at least one end part that does not comprise distribution nozzles and is adapted to be in contact with the support device on a surface greater than or equal to 10% of the inner surface of the removable gas distribution plate, in order to improve heat transfer.

11. The reactor according to claim 1, comprising the substrate cooling control module.

12. The reactor according to claim 11, wherein the substrate cooling control module comprises positioning means and the growth support includes, on its lower surface, recesses adapted to accommodate the positioning means.

13. The reactor according to claim 11, wherein the substrate cooling control module comprises positioning means mobile in vertical translation.

14. The reactor according to claim 1, wherein the wave coupling module is located in an upper part of the first enclosure part and at least 25 cm from a bottom of the second enclosure part.

15. A diamond synthesis method implementing a microwave plasma-assisted deposition reactor for manufacturing synthetic diamond, the method comprising the following steps of:
   placing one or more substrates on the growth support of the modular reactor according to claim 1,
   operating the modular reactor, the operation comprising the following steps of:
      generating a pressure between 0.2 hPa and 500 hPa within the resonant cavity,
      injecting microwaves at a power between 1 kW and 100 kW,
      injecting gases, and
      operating cooling systems of the reactor enclosure, the gas injection system and the substrate holder, as well as the substrate cooling control module to control a temperature of one or more growth surfaces, and
   growing a diamond film.

* * * * *